US012660440B2

(12) United States Patent
Yoon et al.

(10) Patent No.: US 12,660,440 B2
(45) Date of Patent: Jun. 16, 2026

(54) DISPLAY DEVICE

(71) Applicant: SAMSUNG DISPLAY CO., LTD.,
Yongin-si (KR)

(72) Inventors: Jangyeol Yoon, Yongin-si (KR);
Dongchul Shin, Yongin-si (KR); Inseon Yoon, Yongin-si (KR)

(73) Assignee: SAMSUNG DISPLAY CO., LTD.,
Gyeonggi-Do (KR)

( * ) Notice: Subject to any disclaimer, the term of this patent is extended or adjusted under 35 U.S.C. 154(b) by 673 days.

(21) Appl. No.: 17/980,221

(22) Filed: Nov. 3, 2022

(65) Prior Publication Data

US 2023/0225159 A1    Jul. 13, 2023

(30) Foreign Application Priority Data

Jan. 10, 2022    (KR) ........................ 10-2022-0003615

(51) Int. Cl.
H10K 59/131        (2023.01)
*H10K 59/35*        (2023.01)

(52) U.S. Cl.
CPC ......... H10K 59/131 (2023.02); *H10K 59/351* (2023.02)

(58) Field of Classification Search
CPC ........................... H10K 59/131; H10K 59/351
USPC ........................................................ 313/506
See application file for complete search history.

(56) References Cited

U.S. PATENT DOCUMENTS

| | | |
|---|---|---|
| 6,743,982 B2 | 6/2004 | Biegelsen et al. |
| 11,108,004 B2 | 8/2021 | Kim et al. |
| 11,264,578 B2 | 3/2022 | Park et al. |
| 2016/0165718 A1* | 6/2016 | Oh ........................ H05K 1/0268 |
| | | 361/749 |
| 2017/0104175 A1* | 4/2017 | Ide ........................ H10K 50/805 |
| 2019/0012031 A1 | 1/2019 | Kim et al. |
| 2020/0363905 A1* | 11/2020 | Jo ........................ H10K 50/844 |
| 2021/0351259 A1 | 11/2021 | Lee et al. |

FOREIGN PATENT DOCUMENTS

| | | |
|---|---|---|
| CN | 112863339 A | 5/2021 |
| CN | 112863342 A | 5/2021 |
| KR | 1020190006618 A | 1/2019 |
| KR | 20200038800 A | 4/2020 |
| KR | 20200064231 A | 6/2020 |
| KR | 1020210137336 A | 11/2021 |

* cited by examiner

*Primary Examiner* — James R Greece

*Assistant Examiner* — Hana S Featherly

(74) *Attorney, Agent, or Firm* — CANTOR COLBURN LLP

(57)        ABSTRACT

A display device includes a buffer area adjacent to a display area in a specific direction, a pad area arranged in the specific direction with respect to the buffer area, and a middle area including extension areas which extends from the pad area to the buffer area, where a wiring is arranged in the extension areas, and a middle opening area is defined in the middle area at least partially by edges of adjacent extension areas. A first buffer opening area, a second buffer opening area, and a third buffer opening area sequentially defined in the buffer area from the display area to the middle area. In the specific direction, a first width of the first buffer opening area is different from a second width of the second buffer opening area, and the second width is different from a third width of the third buffer opening area.

20 Claims, 34 Drawing Sheets

DISPLAY DEVICE

This application claims priority to Korean Patent Application No. 10-2022-0003615, filed on Jan. 10, 2022, and all the benefits accruing therefrom under 35 U.S.C. § 119, the content of which in its entirety is herein incorporated by reference.

BACKGROUND

1. Field

One or more embodiments relate to a display device.

2. Description of the Related Art

As display devices that display electrical signals visually have developed, various display devices having various desired characteristics, such as reduction in thickness, weight, and power consumption, have been introduced. For example, foldable, rollable, or flexible display devices have been introduced. Recently, stretchable display devices capable of being deformed into various shapes have been under research and development.

A display device may include a display area including a pixel circuit and a light-emitting element connected to the pixel circuit, and a non-display area including a driving circuit and a line configured to apply an electrical signal to the pixel circuit.

SUMMARY

One or more embodiments relate to a display device capable of being deformed into various shapes even in a display area and a non-display area.

According to one or more embodiments, a display device includes a display area including a light-emitting element, a driving circuit area adjacent to the display area in a first direction, where the driving circuit area includes a driving circuit, a buffer area adjacent to the display area and the driving circuit area in a second direction crossing the first direction, a pad area arranged in the second direction with respect to the buffer area, where the pad area includes a pad, and a middle area including a plurality of extension areas which extend from the pad area to the buffer area, where a wiring is arranged in the plurality of extension areas, and a middle opening area is defined in the middle area at least partially by edges of adjacent extension areas. In such an embodiment, the buffer area includes a first buffer area in which a first buffer opening area is defined, a second buffer area in which a second buffer opening area is defined, and a third buffer area in which a third buffer opening area is defined, the first buffer area, the second buffer area, and the third buffer area are sequentially arranged from the display area to the middle area, a first width of the first buffer opening area in the second direction is different from a second width of the second buffer opening area in the second direction, and the second width is different from a third width of the third buffer opening area in the second direction.

In an embodiment, the first width may be greater than the second width, and the third width may be greater than the second width.

In an embodiment, a stretch/contraction ratio of the display area in the second direction may be greater than or equal to a stretch/contraction ratio of the buffer area in the second direction, and a stretch/contraction ratio of the middle area in the second direction may be greater than or equal to the stretch/contraction ratio of the buffer area in the second direction.

In an embodiment, a stretch/contraction ratio of the first buffer area in the second direction may be greater than a stretch/contraction ratio of the second buffer area in the second direction, and the stretch/contraction ratio of the second buffer area in the second direction may be less than a stretch/contraction ratio of the third buffer area in the second direction.

In an embodiment, a stretch/contraction ratio of the first buffer area in the second direction may be less than a stretch/contraction ratio of the second buffer area in the second direction, and the stretch/contraction ratio of the second buffer area in the second direction may be greater than a stretch/contraction ratio of the third buffer area in the second direction.

In an embodiment, the driving circuit area, the buffer area, the pad area, and the middle area may be non-display areas.

In an embodiment, the display area may include a first central area including the light-emitting element, and a first connection area which extends from the first central area, where a signal line may be arranged in the first connection area, and a first opening area may be defined in the display area at least partially by an edge of the first central area and an edge of the first connection area, the driving circuit area may include a second central area including the driving circuit, and a second connection area which extends from the second central area, where a driving circuit wiring is arranged in the second connection area, and a second opening area may be defined in the driving circuit area at least partially by an edge of the second central area and an edge of the second connection area, the buffer area may further include a third central area and a third connection area extending from the third central area, and at least one selected from the first buffer opening area, the second buffer opening area, and the third buffer opening area may be defined at least partially by an edge of the third central area and an edge of the third connection area.

In an embodiment, the wiring may include a first wiring included in one of the plurality of extension areas and a second wiring included in the buffer area and connected to the first wiring.

In an embodiment, the first wiring and the second wiring may be integrally formed as a single unitary and indivisible body.

In an embodiment, at least a portion of the first wiring may overlap at least a portion of the second wiring.

According to one or more embodiments, a display device includes a display area including a light-emitting element, a driving circuit area adjacent to the display area in a first direction, where the driving circuit area includes a driving circuit, a buffer area adjacent to the display area and the driving circuit area in a second direction crossing the first direction, a pad area arranged in the second direction with respect to the buffer area, where the pad area includes a pad, and a middle area including a plurality of extension areas which extend from the buffer area to the pad area, where a plurality wirings is arranged in the plurality of extension areas, and a middle opening area is defined in the middle area at least partially by edges of adjacent extension areas. In such an embodiment the plurality of wirings extend from the extension area to the pad area, and an interval between adjacent wirings among the plurality of wirings in the extension area is less than an interval between the adjacent wirings in the pad area.

In an embodiment, a stretch/contraction ratio of the display area in the second direction may be greater than or equal to a stretch/contraction ratio of the buffer area in the second direction, and a stretch/contraction ratio of the middle area in the second direction may be greater than or equal to the stretch/contraction ratio of the buffer area in the second direction.

In an embodiment, the plurality of extension areas may include an extension area including a first area adjacent to the buffer area and a second area adjacent to the pad area, and in a plan view, a width of the first area in a direction perpendicular to an extending direction of the extension area may be less than a width of the second area in the direction perpendicular to the extending direction of the extension area.

In an embodiment, the middle area may further include a guide area which connects the adjacent extension areas to each other.

In an embodiment, the guide area may include a conductive pattern apart from one of the adjacent wirings.

In an embodiment, a wiring of the plurality of wirings may include a first layer and a second layer disposed on the first layer, the first layer may include a metal material, and the second layer may include at least one selected from a carbon structure and a liquid metal.

In an embodiment, the driving circuit area, the buffer area, the pad area, and the middle area may be non-display areas.

In an embodiment, one of the adjacent wirings may include a first wiring included in one of the plurality of extension areas and a second wiring included in the buffer area and connected to the first wiring.

In an embodiment, the first wiring and the second wiring may be integrally formed by a single unitary and indivisible body.

In an embodiment, at least a portion of the first wiring may overlap at least a portion of the second wiring.

BRIEF DESCRIPTION OF THE DRAWINGS

The above and other features of certain embodiments of the disclosure will be more apparent from the following description taken in conjunction with the accompanying drawings, in which:

FIG. 6 is an enlarged plan view schematically illustrating a portion A and a portion B of the display device of FIG. 3, according to an embodiment;

FIG. 16B is an enlarged plan view schematically illustrating a portion L of the display device of FIG. 8, according to an embodiment;

DETAILED DESCRIPTION

Figure 1:
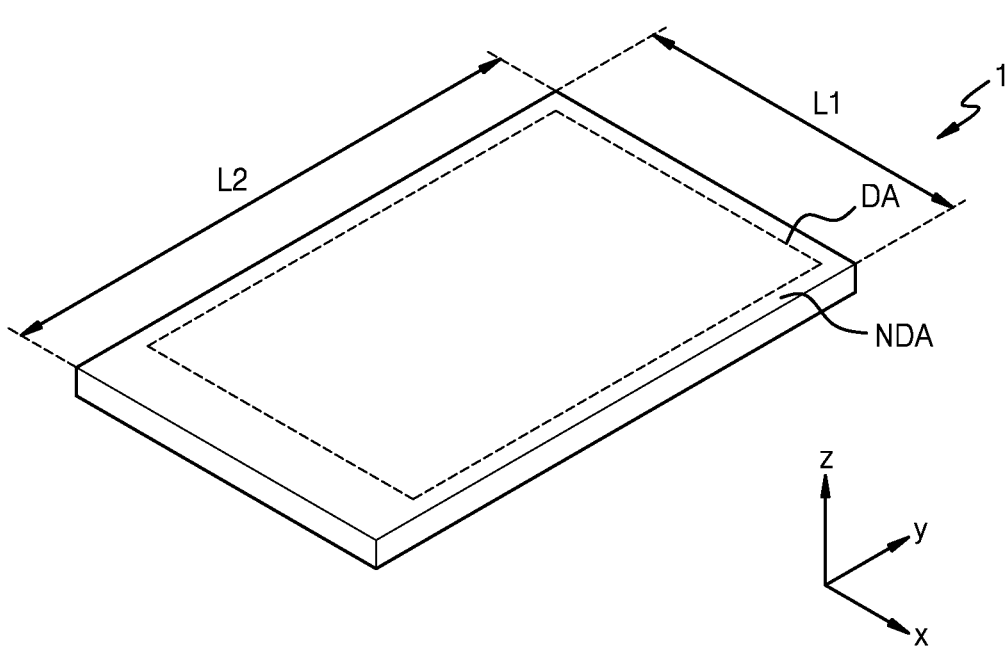
FIG. 1 is a perspective view schematically illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

As the present description allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings. When describing embodiments with reference to the accompanying drawings, the same or corresponding elements are denoted by the same reference numerals.

It will be understood that although the terms "first," "second," etc. may be used herein to describe various elements, these elements should not be limited by these terms. These terms are only used to distinguish one element from another.

The singular forms "a," "an," and "the" as used herein are intended to include the plural forms as well unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b or c" or "at least one selected from a, b and c" indicates only a, only b, only c, both a and b, both a and c, both b and c, all of a, b, and c, or variations thereof.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be further understood that, when a layer, region, or element is referred to as being "on" another layer, region, or element, it may be directly or indirectly on the other layer, region, or element. That is, for example, intervening layers, regions, or elements may be present.

Also, sizes of elements in the drawings may be exaggerated or reduced for convenience of explanation. For example, because sizes and thicknesses of elements in the drawings are arbitrarily illustrated for convenience of explanation, the disclosure is not limited thereto.

When a certain embodiment may be implemented differently, a specific process order may be performed differently from the described order. For example, two consecutively described processes may be performed substantially at the same time or performed in an order opposite to the described order.

It will be further understood that, when layers, regions, or components are referred to as being connected to each other, they may be directly connected to each other or indirectly connected to each other with intervening layers, regions, or components therebetween. For example, when layers, regions, or elements are referred to as being electrically connected to each other, they may be directly electrically connected to each other or indirectly electrically connected to each other with intervening layers, regions, or elements therebetween.

In the following embodiments, the terms "on" and "off" used in connection with an element state may refer to an activated state of the element and an inactive (or deactivated) state of the element, respectively. The terms "on" and "off" used in connection with a signal received by an element may refer to a signal that activates the element and a signal that deactivates the element, respectively. The element may be activated by a high voltage or a low voltage. Hereinafter, a voltage that turns on a transistor is referred to as an on voltage, and a voltage that turns off a transistor is referred to as an off voltage.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

In embodiments, a display device is configured to display an image, and may be included in portable electronic devices, such as game consoles, multimedia devices, or ultra-compact personal computers (PCs). In embodiments, the display device may include a liquid crystal display, an electrophoretic display, an organic light-emitting display, an inorganic electroluminescence (EL) display (or an inorganic light-emitting display), a field emission display, a surface-conduction electron-emitter display, a quantum dot display, a plasma display, and a cathode ray tube display. Hereinafter, for convenience of description, embodiments where a display device is an organic light-emitting display will be described in detail, but various types of display device as described above may be used in embodiments.

Figure 2A:
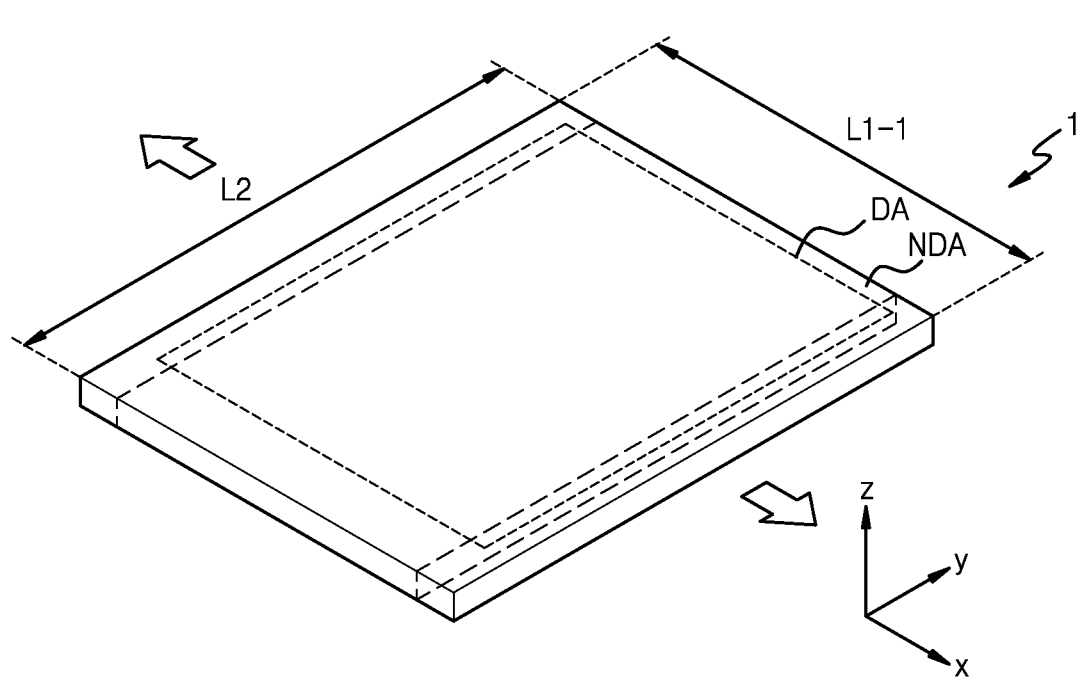
FIG. 2A is a perspective view illustrating a first state in which the display device of FIG. 1 is stretched in a first direction.
Figure 2B:
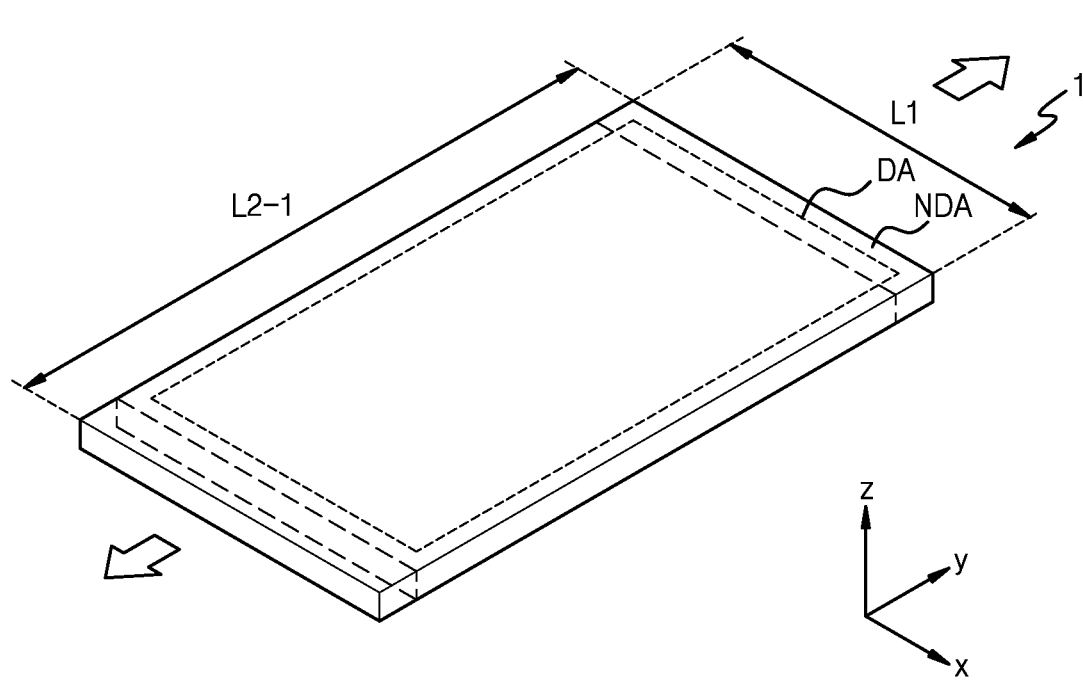
FIG. 2B is a perspective view illustrating a second state in which the display device of FIG. 1 is stretched in a second direction.

FIG. 1 is a perspective view schematically illustrating a display device 1 according to an embodiment. FIG. 2A is a perspective view illustrating a first state in which the display device 1 of FIG. 1 is stretched in a first direction. FIG. 2B is a perspective view illustrating a second state in which the display device 1 of FIG. 1 is stretched in a second direction.

Referring to FIG. 1, the display device 1 may display an image. The display device 1 may include a display area DA and a non-display area NDA. The display area DA may include a plurality of pixels, and the display device 1 may provide a certain image by using pieces of light emitted from the pixels. The non-display area NDA may be adjacent to the display area DA. In an embodiment, the non-display area NDA may completely surround the display area DA.

The display device 1 may include a first side L1 extending in the first direction and a second side L2 extending in the second direction. A thickness direction of the display device 1 may be a third direction perpendicular to the first direction and the second direction. The first side L1 and the second side L2 may be edges of the display device 1. The first direction and the second direction may cross each other. In an embodiment, for example, the first direction and the second direction may form an acute angle. In an alternative embodiment, for example the first direction and the second direction may form an obtuse angle or may be orthogonal to each other. Hereinafter, a case in which the first direction is an x direction or an −x direction and the second direction is a y direction or a −y direction will be mainly described in detail. In this case, the third direction may be a z direction or a −z direction.

Referring to FIGS. 2A and 2B, the display device 1 may be a stretchable display device. Referring to FIG. 2A, when a tensile force is applied to the display device 1 in the first direction (e.g., the x direction or the −x direction), the display device 1 may be stretched in the first direction (e.g., the x direction or the −x direction). In this case, a first side L1-1 of FIG. 2A may be longer than the first side L1 of FIG. 1. Each of the display area DA and the non-display area NDA may be stretched in the first direction (e.g., the x direction or the −x direction). In an alternative embodiment, when a contractile force is applied to the display device 1 in the first direction (e.g., the x direction or the −x direction), the display device 1 may be contracted in the first direction (e.g., the x direction or the −x direction). In this case, the first side L1-1 of FIG. 2A may be shorter than the first side L1 of FIG. 1. Each of the display area DA and the non-display area NDA may be contracted in the first direction (e.g., the x direction or the −x direction).

Referring to FIG. 2B, when a tensile force is applied to the display device 1 in the second direction (e.g., the y direction or the −y direction), the display device 1 may be stretched in the second direction (e.g., the y direction or the −y direction). In this case, a second side L2-1 of FIG. 2B may be longer than the second side L2 of FIG. 1. Each of the display area DA and the non-display area NDA may be stretched in the second direction (e.g., the y direction or the −y direction). In an alternative embodiment, when a contractile force is applied to the display device 1 in the second direction (e.g., the y direction or the −y direction), the display device 1 may be contracted in the second direction (e.g., the y direction or the −y direction). In this case, the second side L2-1 of FIG. 2B may be shorter than the second side L2 of FIG. 1. Each of the display area DA and the non-display area NDA may be contracted in the second direction (e.g., the y direction or the −y direction). In such an embodiment, as described above, when a tensile force or a contractile force is applied to the display device 1, the display device 1 may be deformed into various shapes.

Figure 3:
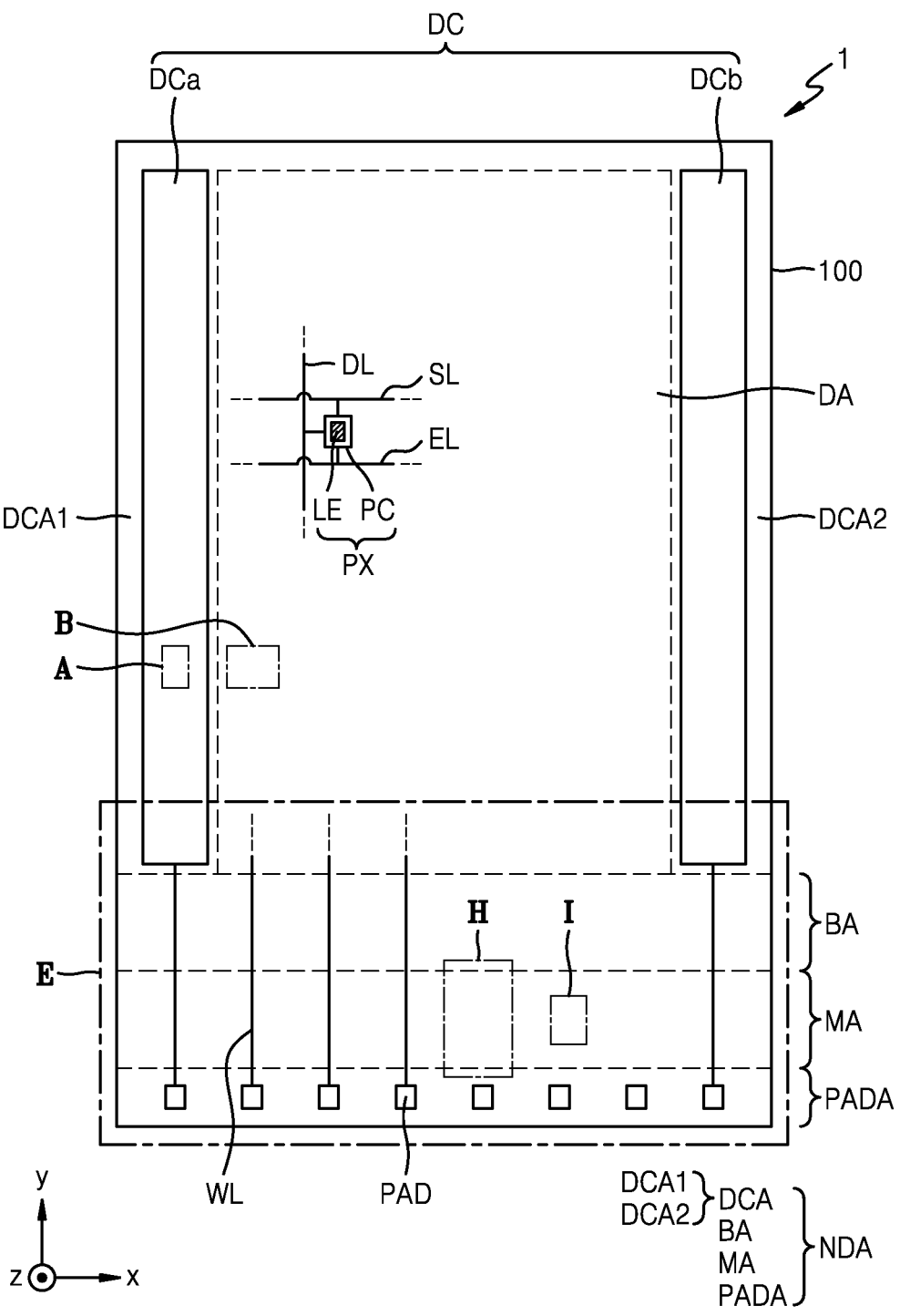
FIG. 3 is a plan view schematically illustrating a display device according to an embodiment.

FIG. 3 is a plan view schematically illustrating a display device 1 according to an embodiment.

Referring to FIG. 3, the display device 1 may include a display area DA and a non-display area NDA. The display area DA may include at least a portion of a substrate 100, a pixel PX, a scan line SL, a data line DL, and an emission control line EL. The non-display area NDA may include at least a portion of the substrate 100, a driving circuit DC, at least a portion of a wiring WL, and a pad PAD.

When an external force is applied to the display area DA, the display area DA may be stretched or contracted. In an embodiment, for example, when an external force is applied to the display area DA in a first direction (e.g., an x direction or an −x direction) and/or a second direction (e.g., a y direction or a −y direction), the display area DA may be stretched or contracted in the first direction (e.g., the x direction or the −x direction) and/or the second direction (e.g., the y direction or the −y direction). In an embodiment, a stretch/contraction ratio of the display area DA in the second direction (e.g., the y direction or the −y direction) may be a ratio of a change in the length of the display area DA in the second direction (e.g., the y direction or the −y direction) when an external force (or a predetermined force) is applied thereto to the length of the display area DA in the second direction (e.g., the y direction or the −y direction) when no external force is applied thereto.

The display area DA may include the pixel PX. In an embodiment, a plurality of pixels PX may be provided in the display area DA. Each of the pixels PX may include a pixel circuit PC and a light-emitting element LE.

The pixel circuit PC may be a circuit configured to control the light-emitting element LE. A plurality of pixel circuits PC may be provided in the display area DA. The pixel circuit PC may include at least one transistor and at least one storage capacitor. In an embodiment, the pixel circuit PC may be connected to a corresponding scan line SL and a corresponding data line DL. In an embodiment, the pixel circuit PC may be further connected to a corresponding emission control line EL.

The light-emitting element LE may be connected to the pixel circuit PC. A plurality of light-emitting elements LE may be provided in the display area DA. The light-emitting element LE may be an organic light-emitting diode including an organic emission layer. Alternatively, the light-emitting element LE may be a light-emitting diode (LED) including an inorganic emission layer. The size of the LED may be on a micro scale or a nano scale. In an embodiment, the LED may include a micro LED. Alternatively, the LED may include a nanorod LED. The nanorod LED may include gallium nitride (GaN). In an embodiment, a color conversion layer may be disposed on the nanorod LED. The color conversion layer may include quantum dots. Alternatively, the light-emitting element LE may include a quantum dot LED including a quantum dot emission layer. Hereinafter, for convenience of description, embodiments in which the light-emitting element LE is an organic light-emitting diode will be mainly described in detail.

The scan line SL may extend in the first direction (e.g., the x direction or the −x direction). The scan line SL may be connected to the driving circuit DC. In an embodiment, the scan line SL may be connected to a scan driving circuit that is included in the driving circuit DC and configured to generate a scan signal. The scan line SL may be connected to the pixel circuit PC. The scan line SL may be configured to receive the scan signal from the scan driving circuit and transmit the scan signal to the pixel circuit PC.

The data line DL may extend in the second direction (e.g., the y direction or the −y direction). The data line DL may be connected to a data driving circuit (not illustrated). The data line DL may be connected to the pixel circuit PC. The data line DL may be configured to receive a data signal from the data driving circuit and transmit the data signal to the pixel circuit PC.

The emission control line EL may extend in the first direction (e.g., the x direction or the −x direction). The emission control line EL may be connected to the driving circuit DC. In an embodiment, the emission control line EL may be connected to an emission control driving circuit that is included in the driving circuit DC and configured to generate an emission control signal. The emission control line EL may be electrically connected to the pixel circuit PC. The emission control line EL may be configured to receive the emission control signal from the emission control driving circuit and transmit the emission control signal to the pixel circuit PC.

The non-display area NDA may be adjacent to the display area DA. In an embodiment, the non-display area NDA may at least partially surround the display area DA. In an embodiment, for example, the non-display area NDA may completely surround the display area DA. The non-display area NDA may include a driving circuit area DCA, a buffer area BA, a middle area MA, and a pad area PADA.

The driving circuit area DCA may be adjacent to the display area DA in the first direction (e.g., the x direction or the –x direction). The driving circuit area DCA may include the driving circuit DC. In an embodiment, the driving circuit area DCA may include a first driving circuit area DCA1 and a second driving circuit area DCA2. The display area DA may be between the first driving circuit area DCA1 and the second driving circuit area DCA2. The driving circuit DC may include a left driving circuit DCa arranged in the first driving circuit area DCA1 and a right driving circuit DCb arranged in the second driving circuit area DCA2. The left driving circuit DCa may be arranged on the left side of the display area DA. The right driving circuit DCb may be arranged on the right side of the display area DA. In some embodiments, one of the left driving circuit DCa and the right driving circuit DCb may be omitted.

When an external force is applied to the driving circuit area DCA, the driving circuit area DCA may be stretched or contracted. In an embodiment, for example, when an external force is applied to the driving circuit area DCA in the first direction (e.g., the x direction or the –x direction) and/or the second direction (e.g., the y direction or the –y direction), the driving circuit area DCA may be stretched or contracted in the first direction (e.g., the x direction or the –x direction) and/or the second direction (e.g., the y direction or the –y direction). In an embodiment, a stretch/contraction ratio of the driving circuit area DCA in the second direction (e.g., the y direction or the –y direction) may be a ratio of a change in the length of the driving circuit area DCA in the second direction (e.g., the y direction or the –y direction) when an external force (or a predetermined force) is applied thereto to the length of the driving circuit area DCA in the second direction (e.g., the y direction or the –y direction) when no external force is applied thereto.

The buffer area BA may be adjacent to the display area DA and the driving circuit area DCA in the second direction (e.g., the y direction or the –y direction). When an external force is applied to the buffer area BA, the buffer area BA may be stretched or contracted. In an embodiment, for example, when an external force is applied to the buffer area BA in the first direction (e.g., the x direction or the –x direction) and/or the second direction (e.g., the y direction or the –y direction), the buffer area BA may be stretched or contracted in the first direction (e.g., the x direction or the –x direction) and/or the second direction (e.g., the y direction or the –y direction). In an embodiment, a stretch/contraction ratio of the buffer area BA in the second direction (e.g., the y direction or the –y direction) may be a ratio of a change in the length of the buffer area BA in the second direction (e.g., the y direction or the –y direction) when an external force (or a predetermined force) is applied thereto to the length of the buffer area BA in the second direction (e.g., the y direction or the –y direction) when no external force is applied thereto.

The wiring WL may be arranged in the buffer area BA. The wiring WL may extend from the pad area PADA to the middle area MA and the buffer area BA. The wiring WL may be a signal line configured to transmit an electrical signal to the driving circuit DC or the pixel PX, or a voltage line configured to transmit a power supply voltage to the driving circuit DC or the pixel PX.

The stretch/contraction ratio of the display area DA may be greater than or equal to the stretch/contraction ratio of the buffer area BA. In an embodiment, the stretch/contraction ratio of the display area DA in the second direction (e.g., the y direction or the –y direction) may be greater than or equal to the stretch/contraction ratio of the buffer area BA in the second direction (e.g., the y direction or the –y direction). In such an embodiment, when an external force is applied in the second direction (e.g., the y direction or the –y direction), a degree of deformation of the display area DA in the second direction (e.g., the y direction or the –y direction) may be greater than or equal to a degree of deformation of the buffer area BA in the second direction (e.g., the y direction or the –y direction). In an embodiment, the stretch/contraction ratio of the display area DA in the first direction (e.g., the x direction or the –x direction) may be greater than or equal to the stretch/contraction ratio of the buffer area BA in the first direction (e.g., the x direction or the –x direction). In such an embodiment, when an external force is applied in the first direction (e.g., the x direction or the –x direction), a degree of deformation of the display area DA in the first direction (e.g., the x direction or the –x direction) may be greater than or equal to a degree of deformation of the buffer area BA in the first direction (e.g., the x direction or the –x direction).

The middle area MA may be adjacent to the buffer area BA in the second direction (e.g., the y direction or the –y direction). The buffer area BA may be between the middle area MA and the display area DA. The wiring WL may be arranged in the middle area MA. When an external force is applied to the middle area MA, the middle area MA may be stretched or contracted. In an embodiment, for example, the middle area MA may be stretched or contracted in the first direction (e.g., the x direction or the –x direction) and/or the second direction (e.g., the y direction or the –y direction). In an embodiment, a stretch/contraction ratio of the middle area MA in the second direction (e.g., the y direction or the –y direction) may be a ratio of a change in the length of the middle area MA in the second direction (e.g., the y direction or the –y direction) when an external force (or a predetermined force) is applied thereto to the length of the middle area MA in the second direction (e.g., the y direction or the –y direction) when no external force is applied thereto.

The stretch/contraction ratio of the middle area MA may be greater than or equal to the stretch/contraction ratio of the buffer area BA. In an embodiment, the stretch/contraction ratio of the middle area MA in the second direction (e.g., the y direction or the –y direction) may be greater than or equal to the stretch/contraction ratio of the buffer area BA in the second direction (e.g., the y direction or the –y direction). In such an embodiment, when an external force is applied in the second direction (e.g., the y direction or the –y direction), a degree of deformation of the middle area MA in the second direction (e.g., the y direction or the –y direction) may be greater than or equal to a degree of deformation of the buffer area BA in the second direction (e.g., the y direction or the –y direction). In an embodiment, the stretch/contraction ratio of the middle area MA in the first direction (e.g., the x direction or the –x direction) may be greater than or equal to the stretch/contraction ratio of the buffer area BA in the first direction (e.g., the x direction or the –x direction). In such an embodiment, when an external force is applied in the first direction (e.g., the x direction or the –x direction), a degree of deformation of the middle area MA in the first direction (e.g., the x direction or the –x direction) may be greater than or equal to a degree of deformation of the buffer area BA in the first direction (e.g., the x direction or the –x direction). In such an embodiment, the buffer area BA may function as a buffer. In an embodiment, for example, the buffer area BA may reduce strain from propagating in a direction from the display area DA to the pad area PADA. In such an embodiment, the buffer area BA with a relatively small degree of deformation may prevent or reduce a damage to the display device 1 between the display area DA and the middle area MA. Therefore, the wiring WL that may be included in the buffer area BA may be protected.

The pad area PADA may be arranged in the second direction (e.g., the y direction or the −y direction) opposite to the buffer area BA. The middle area MA may be between the pad area PADA and the buffer area BA. The pad area PADA may include a pad PAD. In an embodiment, the wiring WL may be connected to the pad PAD. A plurality of pads PAD may be provided in the pad area PADA. A display driver (not illustrated) and/or a display circuit board (not illustrated) may be arranged in the pad area PADA, and the pad PAD may be electrically connected to the display driver and/or the display circuit board.

When an external force is applied to the pad area PADA, the pad area PADA may not be substantially stretched or contracted. When an external force is applied to the pad area PADA, the pad area PADA may be relatively less stretched or contracted. In an embodiment, for example, the stretch/contraction ratio of the pad area PADA may be less than the stretch/contraction ratio of the display area DA. In an embodiment, for example, the stretch/contraction ratio of the pad area PADA may be less than the stretch/contraction ratio of the buffer area BA. In an embodiment, for example, the stretch/contraction ratio of the pad area PADA may be less than the stretch/contraction ratio of the middle area MA. Accordingly, even when the shape of the display device 1 is deformed in a state in which the pad PAD and the display driver and/or the display circuit board are electrically connected to each other, the pad PAD and the display driver and/or the display circuit board may be stably electrically connected to each other. Therefore, a driving failure of the display device 1 may be prevented or reduced.

Figure 4A:
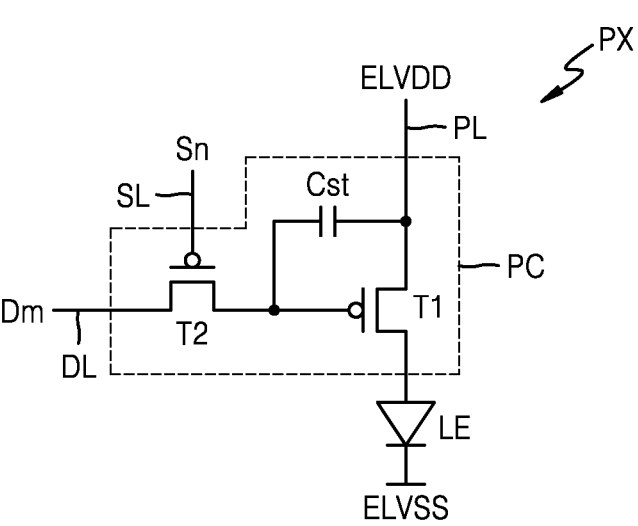
FIGS. 4A and 4B are respectively equivalent circuit diagrams schematically illustrating a pixel of a display device, according to an embodiment.
Figure 4B:
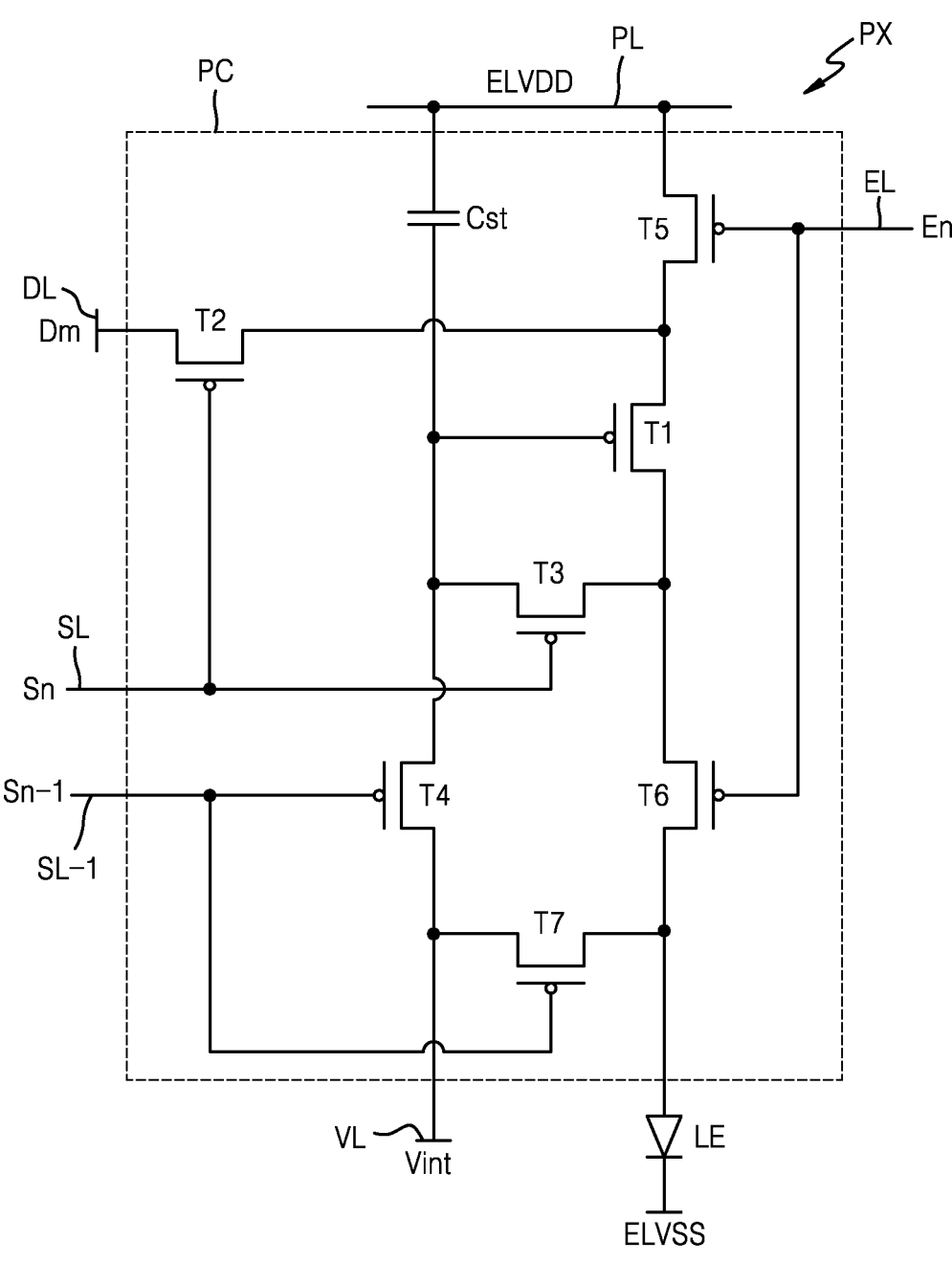

FIGS. 4A and 4B are respectively equivalent circuit diagrams schematically illustrating a pixel PX of a display device, according to an embodiment.

Referring to FIG. 4A, an embodiment of the pixel PX may include a pixel circuit PC and a light-emitting element LE electrically connected to the pixel circuit PC. In an embodiment, the pixel circuit PC may include a driving transistor T1, a switching transistor T2, and a storage capacitor Cst.

The switching transistor T2 may be connected to a scan line SL and a data line DL, and may be configured to transmit, to the driving transistor T1, a data signal Dm input from the data line DL in response to a scan signal Sn input from the scan line SL.

The storage capacitor Cst may be connected to the switching transistor T2 and a driving voltage line PL, and may be configured to store a voltage corresponding to a difference between a voltage received from the switching transistor T2 and a first power supply voltage ELVDD supplied to the driving voltage line PL.

The driving transistor T1 may be connected to the driving voltage line PL and the storage capacitor Cst, and may be configured to control a driving current flowing from the driving voltage line PL to a light-emitting element LE corresponding to a voltage value stored in the storage capacitor Cst. The light-emitting element LE may emit light having a certain luminance based on the driving current. An opposite electrode (e.g., a cathode) of the light-emitting element LE may be configured to receive a second power supply voltage ELVSS.

FIG. 4A illustrates an embodiment where the pixel circuit PC includes two transistors and one storage capacitor, but not being limited thereto. In an alternative embodiment, the pixel circuit PC may include three or more transistors.

Referring to FIG. 4B, an alternative embodiment of the pixel PX may include a pixel circuit PC and a light-emitting element LE. The pixel circuit PC may include a driving transistor T1, a switching transistor T2, a compensation transistor T3, a first initialization transistor T4, an operation control transistor T5, an emission control transistor T6, and a second initialization transistor T7.

FIG. 4B illustrates an embodiment where the pixel circuit PC includes a scan line SL, a previous scan line SL-1, an emission control line EL, a data line DL, an initialization voltage line VL, and a driving voltage line PL, but not being limited thereto. In an alternative embodiment, at least one of the scan line SL, the previous scan line SL-1, the emission control line EL, the data line DL, and the initialization voltage line VL may be shared by neighboring pixel circuits.

A driving drain electrode of the driving transistor T1 may be connected to the light-emitting element LE via the emission control transistor T6. The driving transistor T1 may be configured to receive a data signal Dm based on the switching operation of the switching transistor T2 and supply a driving current to the light emitting element LE.

A switching gate electrode of the switching transistor T2 may be connected to the scan line SL, and a switching source electrode of the switching transistor T2 may be connected to the data line DL. A switching drain electrode of the switching transistor T2 may be connected to a driving source electrode of the driving transistor T1 and connected to the driving voltage line PL via the operation control transistor T5. The switching transistor T2 may be configured to be turned on in response to a scan signal Sn received through the scan line SL and perform a switching operation of transmitting the data signal Dm from the data line DL to the driving source electrode of the driving transistor T1.

A compensation gate electrode of the compensation transistor T3 may be connected to the scan line SL. A compensation source electrode of the compensation transistor T3 may be connected to the driving drain electrode of the driving transistor T1 and connected to a pixel electrode of the light-emitting element LE via the emission control transistor T6. A compensation drain electrode of the compensation transistor T3 may be connected to one electrode of the storage capacitor Cst, a first initialization source electrode of the first initialization transistor T4, and a driving gate electrode of the driving transistor T1. The compensation transistor T3 may be configured to be turned on in response to the scan signal Sn received through the scan line SL and connect the driving gate electrode of the driving transistor T1 to the driving drain electrode of the driving transistor T1. Therefore, the compensation transistor T3 may be diode-connected.

A first initialization gate electrode of the first initialization transistor T4 may be connected to the previous scan line SL-1. A first initialization drain electrode of the first initialization transistor T4 may be connected to the initialization voltage line VL. The first initialization source electrode of the first initialization transistor T4 may be connected to one electrode of the storage capacitor Cst, the compensation drain electrode of the compensation transistor T3, and the driving gate electrode of the driving transistor T1. The first initialization transistor T4 may be configured to be turned on in response to a previous scan signal Sn-1 received through the previous scan line SL-1, transmit an initialization voltage Vint to the driving gate electrode of the driving transistor T1, and perform an initialization operation of initializing the voltage of the driving gate electrode of the driving transistor T1.

An operation control gate electrode of the operation control transistor T5 may be connected to the emission control line EL. An operation control source electrode of the operation control transistor T5 may be connected to the driving voltage line PL. An operation control drain electrode of the operation control transistor T5 may be connected to the driving source electrode of the driving transistor T1 and the switching drain electrode of the switching transistor T2.

An emission control gate electrode of the emission control transistor T6 may be connected to the emission control line EL. An emission control source electrode of the emission control transistor T6 may be connected to the driving drain electrode of the driving transistor T1 and the compensation source electrode of the compensation transistor T3. An emission control drain electrode of the emission control transistor T6 may be electrically connected to the pixel electrode of the light-emitting element LE. The operation control transistor T5 and the emission control transistor T6 may be simultaneously turned on in response to an emission control signal En received through the emission control line EL and transmit a first power supply voltage ELVDD to the light-emitting element LE, so that a driving current flows through the light-emitting element LE.

A second initialization gate electrode of the second initialization transistor T7 may be connected to the previous scan line SL-1. A second initialization source electrode of the second initialization transistor T7 may be connected to the pixel electrode of the light-emitting element LE. A second initialization drain electrode of the second initialization transistor T7 may be connected to the initialization voltage line VL. The second initialization transistor T7 may be configured to be turned on in response to the previous scan signal Sn-1 received through the previous scan line SL-1 and initialize the pixel electrode of the light-emitting element LE.

FIG. 4B illustrates an embodiment in which both the first initialization transistor T4 and the second initialization transistor T7 are connected to the previous scan line SL-1, but not being limited thereto. In an alternative embodiment, the first initialization transistor T4 and the second initialization transistor T7 may be connected to the previous scan line SL-1 and a subsequent scan line (not illustrated), respectively, and the first initialization transistor T4 and the second initialization transistor T7 may be driven in response to the previous scan signal Sn-1 and a subsequent scan signal, respectively.

The other electrode of the storage capacitor Cst may be connected to the driving voltage line PL. The one electrode of the storage capacitor Cst may be connected to the driving gate electrode of the driving transistor T1, the compensation drain electrode of the compensation transistor T3, and the first initialization source electrode of the first initialization transistor T4.

The opposite electrode (e.g., the cathode) of the light-emitting element LE may be configured to receive the second power supply voltage ELVSS. The light-emitting element LE may be configured to emit light based on the driving current received from the driving transistor T1.

Figure 5:
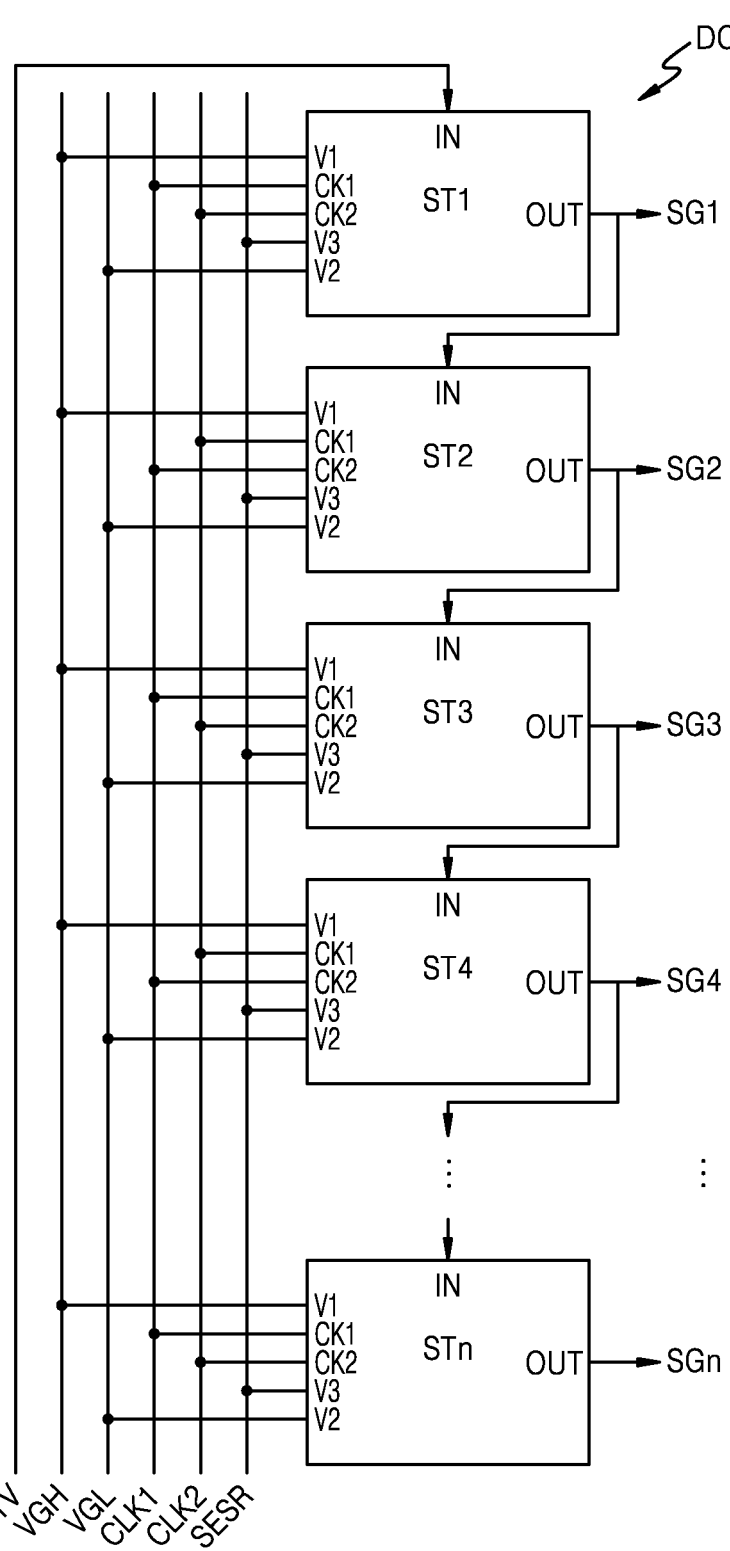
FIG. 5 is a diagram schematically illustrating a driving circuit according to an embodiment.

FIG. 5 is a diagram schematically illustrating a driving circuit DC according to an embodiment.

Referring to FIG. 5, an embodiment of the driving circuit DC may include a plurality of stages. In an embodiment, for example, the stages may include first to n-th stages ST1 to STn. The first to n-th stages ST1 to STn may respectively correspond to pixel rows (pixel lines) provided in the display area. The number of stages of the driving circuit DC may variously change based on the number of pixel rows. Each of the first to n-th stages ST1 to STn may include at least one transistor and at least one storage capacitor.

Each of the first to n-th stages ST1 to STn may output signals in response to a start signal or a previous signal. In an embodiment, a signal output from each of the first to n-th stages ST1 to STn may be the scan signal Sn or the previous scan signal Sn-1 to be applied to the pixel circuit PC of FIG. 4A or 4B. In an embodiment, a signal output from each of the first to n-th stages ST1 to STn may be the scan emission control signal Sn-1 to be applied to the pixel circuit PC of FIG. 4A or 4B.

Each of the first to n-th stages ST1 to STn may include an input terminal IN, a first clock terminal CK1, a second clock terminal CK2, a first voltage input terminal V1, a second voltage input terminal V2, a third voltage input terminal V3, and an output terminal OUT.

The input terminal IN may be configured to receive an external signal STV or a previous signal as a start signal. In an embodiment, the external signal STV may be applied to the input terminal IN of the first stage ST1, and the previous signal output from the previous stage may be applied to the input terminal IN of each of the second to n-th stages ST2 to STn other than the first stage ST1. In an embodiment, for example, the first stage ST1 may start to be driven by the external signal STV and may be configured to generate and output a first signal SG1. The second stage ST2 may start to be driven by the first signal SG1 and may be configured to generate and output a second signal SG2. A (n−1)-th signal output from the (n−1)-th stage may be input to the input terminal IN of the n-th stage STn, and the n-th stage STn may be configured to generate and output an n-th signal SGn.

A first clock signal CLK1 or a second clock signal CLK2 may be applied to the first clock terminal CK1 and the second clock terminal CK2. In an embodiment, the first clock signal CLK1 and the second clock signal CLK2 may be alternately applied to the first to n-th stages ST1 to STn. In an embodiment, for example, the first clock signal CLK1 may be applied to the first clock terminal CK1 of the odd-numbered stage, and the second clock signal CLK2 may be applied to the second clock terminal CK2 of the odd-numbered stage. The second clock signal CLK2 may be applied to the first clock terminal CK1 of the even-numbered stage, and the first clock signal CLK1 may be applied to the second clock terminal CK2 of the even-numbered stage.

The first voltage input terminal V1 may be configured to receive a first voltage VGH of a high voltage, and the second voltage input terminal V2 may be configured to receive a second voltage VGL of a low voltage. The first voltage VGH and the second voltage VGL may be rated voltages to be applied to the driving circuit DC. The first voltage VGH and the second voltage VGL may be supplied from a controller (not illustrated) and/or a power supply (not illustrated) as global signals. The third voltage input terminal V3 may be configured to receive a third voltage SESR. The third voltage SESR may be a voltage for preventing a flicker of the display device. In some embodiments, the third voltage SESR may be omitted.

The output terminal OUT may be configured to output a signal. In an embodiment, the signal may be supplied through the scan line or the previous scan line to the pixel circuit as the scan signal or the previous scan signal. Alternatively, the signal may be supplied through an emission control line to the pixel circuit as the emission control signal. In an embodiment, the signal may be supplied to the input terminal IN of the next stage as a carry signal.

Figure 6:
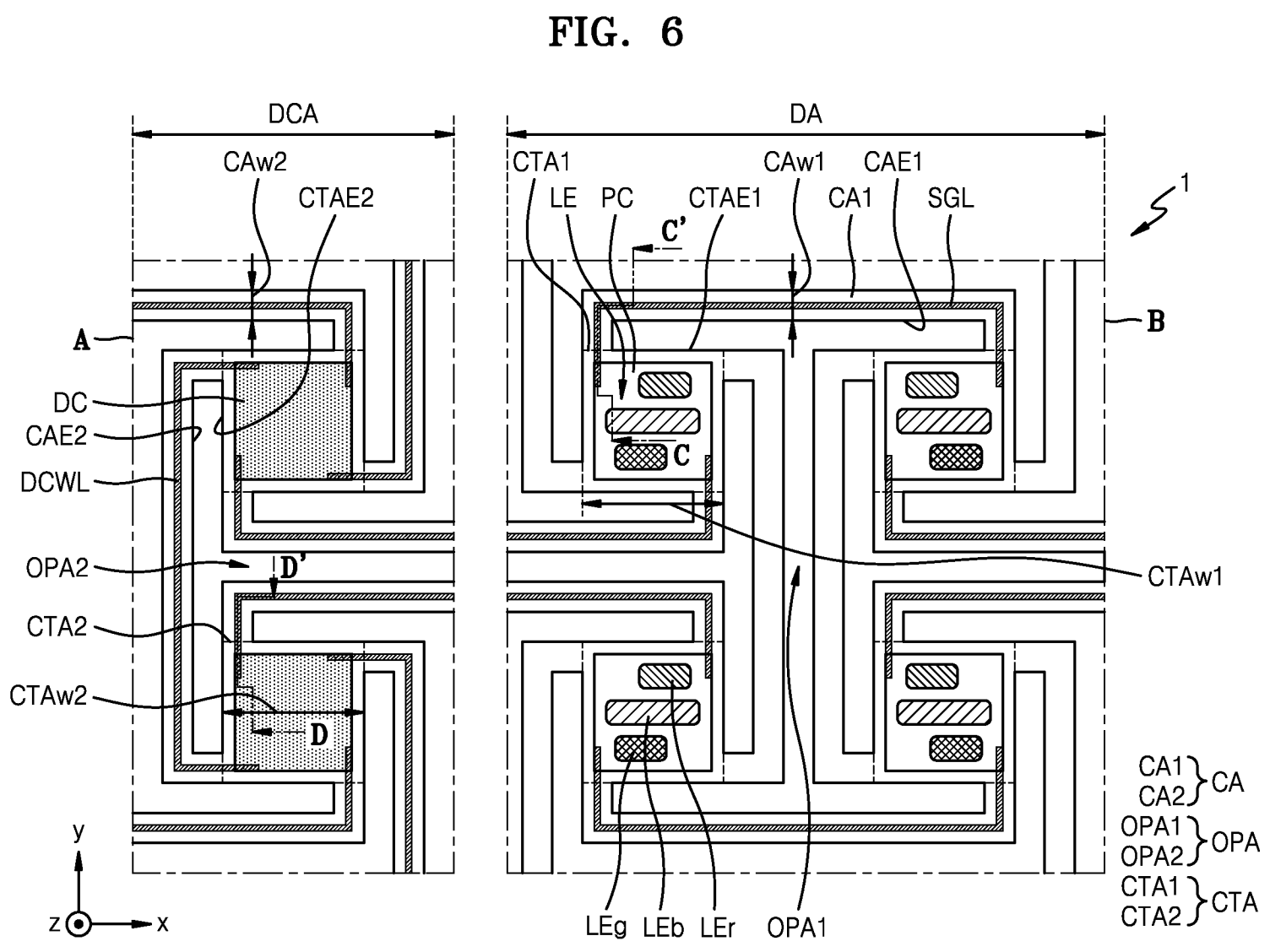

FIG. 6 is an enlarged plan view schematically illustrating a portion A and a portion B of the display device 1 of FIG. 3, according to an embodiment.

Referring to FIG. 6, an embodiment of the display device 1 may include a display area DA and a driving circuit area DCA. The display device 1 may include a central area CTA, a connection area CA, and an opening area OPA. The central area CTA may be an area in which components of the display device 1 are arranged. A plurality of central areas CTA may be provided. The central areas CTA may be apart from each other. The connection area CA may connect the adjacent central areas CTA to each other. In the present specification, the expression "the adjacent central areas CTA are connected to each other by the connection areas CA" means that the connection area CA extends between the adjacent center areas CTA, and the adjacent center areas CTA and the connection area CA are integrally formed as a single unitary and indivisible body. A plurality of connection areas CA may be provided. The opening area OPA may be an area in which components of the display device 1 are not arranged. A plurality of opening areas OPA may be provided or defined in the opening area OPA. The opening areas OPA may be apart from each other. The central areas CTA, the connection areas CA, and the opening areas OPA may be included in the display area DA and/or the driving circuit area DCA.

The display area DA may include a first central area CTA1, a first connection area CA1, a signal line SGL, and a first opening area OPA1. A plurality of first central areas CTA1 may be provided. The first central areas CTA1 may be arranged in a first direction (e.g., an x direction or a −x direction) and/or a second direction (e.g., a y direction or a −y direction). The first central area CTA1 may include a pixel circuit PC and a light-emitting element LE. The light-emitting element LE may be connected to the pixel circuit PC. In an embodiment, the light-emitting element LE may include a red light-emitting element LEr, a green light-emitting element LEg, and a blue light-emitting element LEb. The red light-emitting element LEr, the green light-emitting element LEg, and the blue light-emitting element LEb may emit red light, green light, and blue light, respectively. In an alternative embodiment, the light-emitting element LE may include the red light-emitting element LEr, the green light-emitting element LEg, the blue light-emitting element LEb, and a white light-emitting element.

The first connection area CA1 may be a first bridge area. The adjacent first central areas CTA1 may be connected to each other by the first connection area CA1. In an embodiment, for example, one first central area CTA1 may be connected to four first connection areas CA1. The four first connection areas CA1 may extend from vertices of the one first central area CTA1, respectively. The four first connection areas CA1 may extend to the adjacent first central areas CTA1, respectively. Accordingly, the adjacent first central areas CTA1 may be connected to each other.

The extending direction of the first connection area CA1 may be changed. In an embodiment, for example, the extending direction of the first connection area CA1 may be changed from the second direction (e.g., the y direction or the −y direction) to the first direction (e.g., the x direction or the −x direction). In an alternative embodiment, for example, the extending direction of the first connection area CA1 may be changed from the first direction (e.g., the x direction or the −x direction) to the second direction (e.g., the y direction or the −y direction). FIG. 6 illustrates an embodiment where the edge of the first connection area CA1 is bent at a right angle, but not being limited thereto. In an alternative embodiment, the edge of the first connection area CA1 may be bent at various angles. In an alternative embodiment, the edge of the first connection area CA1 may be curved.

The signal line SGL may be arranged in the first connection area CA1. The signal line SGL may be configured to transmit a signal to the pixel circuit PC. In an embodiment, the signal line SGL may be configured to transmit a signal output from the driving circuit DC. Although not illustrated, a power line configured to transmit a power supply voltage to the pixel circuit PC and a data line configured to transmit a data signal to the pixel circuit PC may be further arranged in the first connection area CA1.

The first opening area OPA1 may be between the adjacent first central areas CTA1. The first opening area OPA1 may be defined at least partially by an edge CTAE1 of the first central area CTA1 and an edge CAE1 of the first connection area CA1.

FIG. 6 illustrates an embodiment where four first central areas CTA1 and first connection areas CA1 connected to the four first central areas CTA1, and the four first central areas CTA1 and the first connection areas CA1 connected to the four first central areas CTA1 may be defined as a first basic unit. The first basic unit may be repeated in the display area DA in the first direction (e.g., the x direction or the −x direction) and/or the second direction (e.g., the y direction or the −y direction).

The driving circuit area DCA may include a second central area CTA2, a second connection area CA2, a driving circuit wiring DCWL, and a second opening area OPA2. A plurality of second central areas CTA2 may be provided. The second central areas CTA2 may be arranged in the first direction (e.g., the x direction or the −x direction) and/or the second direction (e.g., the y direction or the −y direction). The driving circuit area DCA may include the driving circuit DC. A plurality of driving circuits DC may be provided in the driving circuit area DCA. The driving circuit DC may be configured to generate and output a signal to be applied to the pixel circuit PC arranged in the same row.

The second connection area CA2 may be a second bridge area. The adjacent second central areas CTA2 may be connected to each other by the second connection area CA2. In an embodiment, for example, one second central area CTA2 may be connected to four second connection areas CA2. The four second connection areas CA2 may extend from vertices of the one second central area CTA2, respectively. The four second connection areas CA2 may extend to the adjacent second central areas CTA2, respectively. Accordingly, the adjacent second central areas CTA2 may be connected to each other.

The extending direction of the second connection area CA2 may be changed. In an embodiment, for example, the extending direction of the second connection area CA2 may be changed from the second direction (e.g., the y direction or the −y direction) to the first direction (e.g., the x direction or the −x direction). In an alternative embodiment, for example, the extending direction of the second connection area CA2 may be changed from the first direction (e.g., the x direction or the −x direction) to the second direction (e.g., the y direction or the −y direction). FIG. 6 illustrates an embodiment where the edge of the second connection area CA2 is bent at a right angle, but not being limited thereto. In an alternative embodiment, the edge of the second connection area CA2 may be bent at various angles. In an alternative embodiment, the edge of the second connection area CA2 may be curved.

The driving circuit wiring DCWL may be arranged in the second connection area CA2. The driving circuit wiring DCWL may be electrically connected to the driving circuit DC. In an embodiment, the driving circuit wiring DCWL may be configured to transmit an external signal or a previous signal. In an alternative embodiment, the driving circuit wiring DCWL may be a clock signal line configured to transmit a clock signal for driving the driving circuit DC. In an alternative embodiment, the driving circuit wiring DCWL may be a power line configured to supply a rated voltage for driving the driving circuit DC. In an alternative embodiment, the driving circuit wiring DCWL may be a signal line SGL configured to transmit a signal output from the driving circuit DC to the pixel circuit PC. In an alternative embodiment, the driving circuit wiring DCWL may be a carry signal line configured to transmit a carry signal output from the driving circuit DC to the adjacent driving circuit DC.

The second opening area OPA2 may be between the adjacent second central areas CTA2. The second opening area OPA2 may be defined at least partially by an edge CTAE2 of the second central area CTA2 and an edge CAE2 of the second connection area CA2.

In a plan view (or a plan view in the third direction or the z direction), the shape of the first central area CTA1 may be the same as the shape of the second central area CTA2. In a plan view, a width CTAw1 of the first central area CTA1 may be equal to a width CTAw2 of the second central area CTA2. In a plan view, the width CTAw1 of the first central area CTA1 may be a distance between edges of the first central area CTA1 opposite to each other in the first direction (e.g., the x direction or the –x direction). In a plan view, the width CTAw2 of the second central area CTA2 may be a distance between edges of the second central area CTA2 opposite to each other in the first direction (e.g., the x direction or the –x direction).

The shape of the first connection area CA1 may be the same as the shape of the second connection area CA2. The width CAw1 of the first connection area CA1 may be equal to the width CAw2 of the second connection area CA2. The width CAw1 of the first connection area CA1 may be a distance between edges of the first connection area CA1 opposite to each other in the first direction (e.g., the x direction or the –x direction). The width CAw2 of the second connection area CA2 may be a distance between edges of the second connection area CA2 opposite to each other in the first direction (e.g., the x direction or the –x direction). Accordingly, the shape of the display device 1 in the display area DA may be the same as the shape of the display device 1 in the driving circuit area DCA. In such an embodiment, a phenomenon in which stress is concentrated at the boundary between the display area DA and the driving circuit area DCA may be effectively prevented or substantially reduced.

Figure 7A:
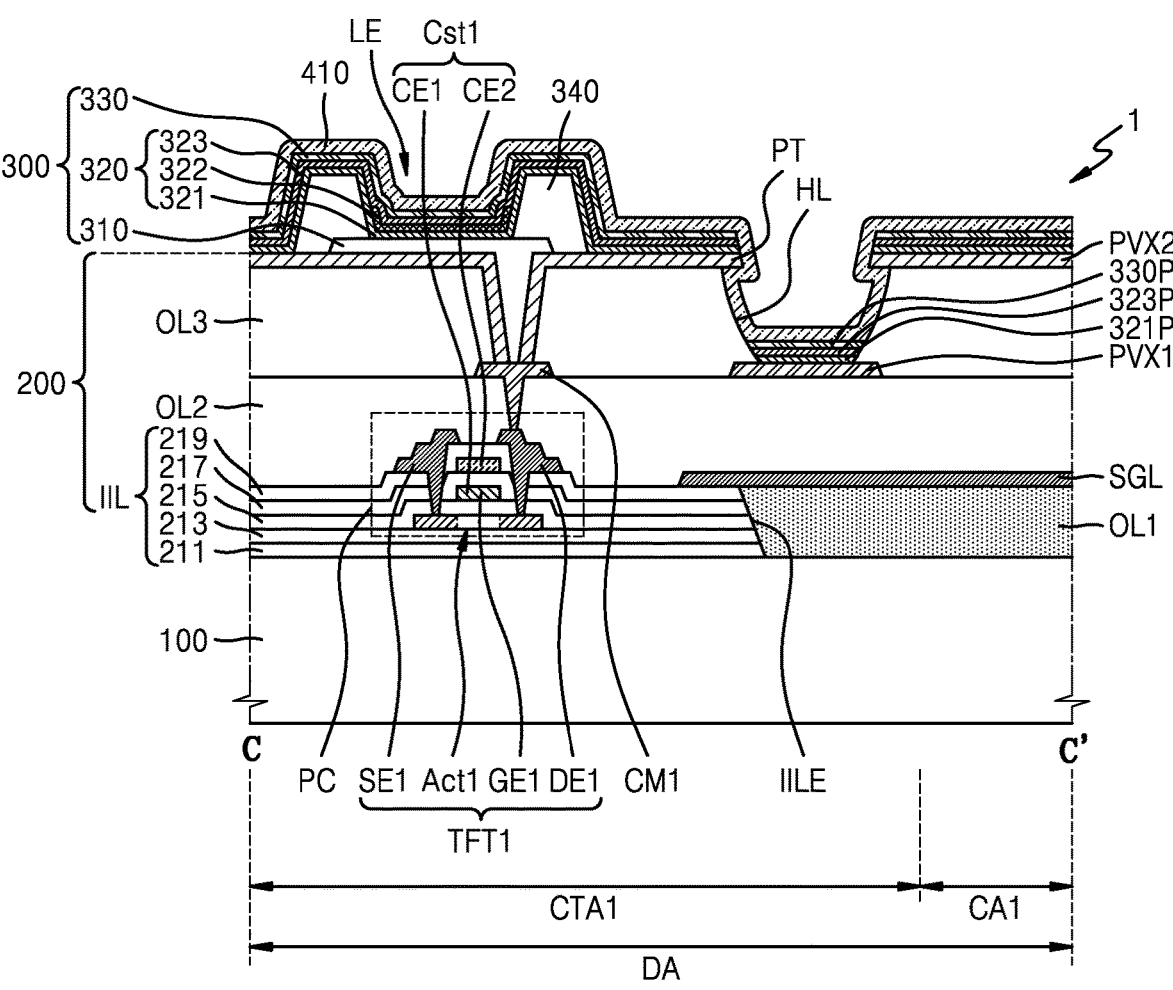
FIG. 7A is a schematic cross-sectional view of the display device taken along line C-C' of FIG. 6, according to an embodiment.

FIG. 7A is a schematic cross-sectional view of the display device 1 taken along line C-C' of FIG. 6, according to an embodiment.

Referring to FIG. 7A, an embodiment of the display device 1 may include a display area DA. The display area DA may include a first central area CTA1 and a first connection area CA1. The display area DA may include a substrate 100, a circuit layer 200, a light-emitting element layer 300, and an inorganic encapsulation layer 410.

The substrate 100 may include a polymer resin, such as polyethersulfone, polyarylate, polyetherimide, polyethylene naphthalate, polyethylene terephthalate, polyphenylene sulfide, polyimide, polycarbonate, cellulose triacetate, or cellulose acetate propionate. In an embodiment, the substrate 100 may have a multi-layer structure including a base layer (not illustrated) and a barrier layer (not illustrated), each including the polymer resin described above. The substrate 100 including the polymer resin may be flexible, rollable, and bendable. In some embodiments, the substrate 100 may include glass.

The circuit layer 200 may be disposed on the substrate 100. The circuit layer 200 may include a pixel circuit PC, a signal line SGL, an inorganic insulating layer IIL, a first organic insulating layer OL1, a second organic insulating layer OL2, a first contact electrode CM1, a third organic insulating layer OL3, a first inorganic layer PVX1, and a second inorganic layer PVX2. The pixel circuit PC may include a first transistor TFT1 and a first storage capacitor Cst1. The first transistor TFT1 may include a first semiconductor layer Act1, a first gate electrode GE1, a first source electrode SE1, and a first drain electrode DE1. The first storage capacitor Cst1 may include a first capacitor electrode CE1 and a second capacitor electrode CE2.

The inorganic insulating layer IIL may be disposed on the substrate 100. The inorganic insulating layer IIL may include a barrier layer 211, a buffer layer 213, a first gate insulating layer 215, a second gate insulating layer 217, and an interlayer insulating layer 219.

The barrier layer 211 may be disposed on the substrate 100. The barrier layer 211 may prevent or reduce infiltration of foreign material. The barrier layer 211 may be defined by a single layer or layers, each including an inorganic material, such as silicon nitride ($SiN_x$), silicon oxide ($SiO_2$), and/or silicon oxynitride (SiON).

The buffer layer 213 may be disposed on the barrier layer 211. The buffer layer 213 may include an inorganic insulating material, such as silicon nitride ($SiN_x$), silicon oxynitride (SiON), or silicon oxide ($SiO_2$), and may be defined by a single layer or layers, each including the inorganic insulating material described above.

The first semiconductor layer Act1 may be disposed on the buffer layer 213. The first semiconductor layer Act1 may include polysilicon. Alternatively, the first semiconductor layer Act may include amorphous silicon, an oxide semiconductor, or an organic semiconductor. In an embodiment, the first semiconductor layer Act1 may include a channel region, and a source region and a drain region respectively on opposing sides of the channel region.

The first gate insulating layer 215 may be disposed on the first semiconductor layer Act1 and the buffer layer 213. The first gate insulating layer 215 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). The zinc oxide ($ZnO_x$) may include ZnO and/or $ZnO_2$.

The first gate electrode GE1 may be disposed on the first gate insulating layer 215. The first gate electrode GE1 may overlap the channel region of the first semiconductor layer Act1. The first gate electrode GE1 may include a low-resistance metal material. In an embodiment, the first gate electrode GE1 may include a conductive material including molybdenum (Mo), aluminum (Al), copper (Cu), titanium (Ti), and the like, and may be defined by a single layer or layers, each including the conductive material described above.

The second gate insulating layer 217 may be disposed on the first gate electrode GE1 and the first gate insulating layer 215. The second gate insulating layer 217 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$).

The second capacitor electrode CE2 may be disposed on the second gate insulating layer 217. The second capacitor electrode CE2 may overlap the first gate electrode GE1. In such an embodiment, the first gate electrode GE1 may function as the first capacitor electrode CE1. FIG. 7A illustrates an embodiment where the first storage capacitor Cst1 overlaps the first transistor TFT1, but not being limited thereto. In an alternative embodiment, the first storage capacitor Cst1 may not overlap the first transistor TFT1. In such an embodiment, the first capacitor electrode CE1 and the first gate electrode GE1 may be separate electrodes. The second capacitor electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may be defined by a single layer or layers, each including the material described above.

The interlayer insulating layer 219 may be disposed on the second capacitor electrode CE2 and the second gate insulating layer 217. The interlayer insulating layer 219 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$).

The first source electrode SE1 and the first drain electrode DE1 may be disposed on the interlayer insulating layer 219. The first source electrode SE1 and the first drain electrode DE1 may be respectively connected to the first semiconductor layer Act1 through contact holes provided or defined in the first gate insulating layer 215, the second gate insulating layer 217, and the interlayer insulating layer 219. At least one selected from the first source electrode SE1 and the first drain electrode DE1 may include a conductive material including molybdenum (Mo), aluminum (Al), copper (Cu), titanium (Ti), and the like, and may be defined by a single layer or layers, each including the conductive material described above. In an embodiment, at least one selected from the first source electrode SE1 and the first drain electrode DE1 may have a multi-layer structure of Ti/Al/Ti.

In an embodiment, in the display area DA, the inorganic insulating layer IIL may overlap the first central area CTA1, and may not overlap the first connection area CA1. The inorganic insulating layer IIL may have an end IILE of the inorganic insulating layer IIL facing the first connection area CA1. Accordingly, the display device 1 may be flexible in the first connection area CA1. FIG. 7A illustrates an embodiment where the end IILE of the inorganic insulating layer IIL does not have a step difference, but not being limited thereto. In an alternative embodiment, the end IILE of the inorganic insulating layer IIL may have a step difference. In some embodiments, the inorganic insulating layer IIL may overlap the first central area CTA1 and the first connection area CA1.

The first organic insulating layer OL1 may overlap the first connection area CA1. The first organic insulating layer OL1 may cover the end IILE of the inorganic insulating layer IIL. The first organic insulating layer OL1 may minimize a height difference when the signal line SGL extends from the first central area CTA1 to the first connection area CA1, or may absorb stress that may be simultaneously applied to the signal line SGL. The first organic insulating layer OL1 may include an organic material. The first organic insulating layer OL1 may include an organic insulating material, such as general-purpose polymer (e.g., polymethylmethacrylate (PMMA) or polystyrene (PS)), polymer derivatives having a phenolic group, acrylic polymer, imide polymer, aryl ether polymer, amide polymer, fluorine polymer, p-xylene polymer, vinyl alcohol polymer, or any blend thereof.

The signal line SGL may be disposed on the inorganic insulating layer IIL and the first organic insulating layer OL1. The signal line SGL may extend from the first central area CTA1 to the first connection area CA1. Although not illustrated, the signal line SGL may be electrically connected to the pixel circuit PC. The signal line SGL may include a conductive material including molybdenum (Mo), aluminum (Al), copper (Cu), or titanium (Ti), and the like, and may be defined by a single layer or layers, each including the conductive material described above. In an embodiment, the signal line SGL may have a multi-layer structure of Ti/Al/Ti.

The second organic insulating layer OL2 may be disposed on the inorganic insulating layer IIL, the first source electrode SE1, the first drain electrode DE1, and the signal line SGL. The second organic insulating layer OL2 may include an organic material. The second organic insulating layer OL2 may include an organic insulating material, such as general-purpose polymer (e.g., PMMA or PS), polymer derivatives having a phenolic group, acrylic polymer, imide polymer, aryl ether polymer, amide polymer, fluorine polymer, p-xylene polymer, vinyl alcohol polymer, or any blend thereof.

The signal line SGL may be between the first organic insulating layer OL1 and the second organic insulating layer OL2 in the first connection area CA1. When the shape of the display device 1 is deformed, the first connection area CA1 may be bent. In this case, a stress neutral plane may exist in the display device 1. Because the signal line SGL is between the first organic insulating layer OL1 and the second organic insulating layer OL2, the signal line SGL may be located on a stress neutral plane. Accordingly, stress applied to the signal line SGL may be minimized.

The first contact electrode CM1 may overlap the first central area CTA1 and may be disposed on the second organic insulating layer OL2. The first contact electrode CM1 may be electrically connected to the pixel circuit PC through a contact hole defined in the second organic insulating layer OL2. The first contact electrode CM1 may include a conductive material including molybdenum (Mo), aluminum (Al), copper (Cu), titanium (Ti), and the like, and may be defined by a single layer or layers, each including the conductive material described above. The first contact electrode CM1 may have a multi-layer structure of Ti/Al/Ti.

The third organic insulating layer OL3 may be disposed on the second organic insulating layer OL2 and the first contact electrode CM1. The third organic insulating layer OL3 may include an organic material. The third organic insulating layer OL3 may include an organic insulating material, such as general-purpose polymer (e.g., PMMA or PS), polymer derivatives having a phenolic group, acrylic polymer, imide polymer, aryl ether polymer, amide polymer, fluorine polymer, p-xylene polymer, vinyl alcohol polymer, or any blend thereof.

The first inorganic layer PVX1 may be between the second organic insulating layer OL2 and the third organic insulating layer OL3. The first inorganic layer PVX1 may include an inorganic material.

A hole HL may be defined through the third organic insulating layer OL3. The hole HL may expose the first inorganic layer PVX1. The hole HL may be formed by etching the third organic insulating layer OL3, and the first inorganic layer PVX1 may prevent or reduce overetching of a component disposed under the first inorganic layer PVX1.

The second inorganic layer PVX2 may be disposed on the third organic insulating layer OL3. The second inorganic layer PVX2 may have a protruding tip PT protruding toward the center of the hole HL. A lower surface of the protruding tip PT of the second inorganic layer PVX2 may be exposed through the hole HL.

The light-emitting element layer 300 may be disposed on the circuit layer 200. The light-emitting element layer 300 may include a light-emitting element LE and a pixel defining layer 340. The light-emitting element LE may be an organic light-emitting diode. The light-emitting element LE may include a pixel electrode 310, a middle layer 320, and an opposite electrode 330.

The pixel electrode 310 may be electrically connected to the first contact electrode CM1 through a contact hole defined in the third organic insulating layer OL3. Accordingly, the light-emitting element LE may be electrically connected to the pixel circuit PC. The pixel electrode 310 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In an alternative embodiment, the pixel electrode 310 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. In an alternative embodiment, the pixel electrode 310 may further include a layer including ITO, IZO, ZnO, or $In_2O_3$ above and/or below the reflective layer.

The pixel defining layer 340 may cover the edge of the pixel electrode 310. A pixel opening may be defined through the pixel defining layer 340, and the pixel opening may overlap the pixel electrode 310. The pixel opening may define an emission area of light emitted from the light-emitting element LE. The pixel defining layer 340 may include an organic insulating material and/or an inorganic insulating material. In some embodiments, the pixel defining layer 340 may include a light blocking material.

The middle layer 320 may be disposed on the pixel electrode 310, the pixel defining layer 340, and/or the second inorganic layer PVX2. The middle layer 320 may include an emission layer 322. The emission layer 322 may overlap the pixel electrode 310. The emission layer 322 may include a high molecular weight organic material or a low molecular weight organic material that emits light of a certain color.

The middle layer 320 may further include at least one of a first functional layer 321 and a second functional layer 323. The first functional layer 321 may be between the pixel electrode 310 and the emission layer 322. The first functional layer 321 may include a hole transport layer (HTL) and/or a hole injection layer (HIL). The second functional layer 323 may be between the emission layer 322 and the opposite electrode 330. The second functional layer 323 may include an electron transport layer (ETL) and/or an electron injection layer (EIL). In an embodiment, the first functional layer 321 and the second functional layer 323 may completely overlap the first central area CTA1 and the first connection area CA1.

The opposite electrode 330 may be disposed on the pixel electrode 310, the middle layer 320, and the pixel defining layer 340. The opposite electrode 330 may include a conductive material having a low work function. In an embodiment, for example, the opposite electrode 330 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 330 may further include a layer including ITO, IZO, ZnO, or $In_2O_3$ on the (semi) transparent layer including the material described above.

The protruding tip PT may improve the reliability of the display device 1. At least one selected from the first functional layer 321 and the second functional layer 323 may include an organic material, and external oxygen or moisture may flow into the light-emitting element LE through at least one selected from the first functional layer 321 and the second functional layer 323. Such external oxygen or moisture may damage the light-emitting element LE. In such an embodiment, where the second inorganic layer PVX2 has the protruding tip PT protruding toward the center of the hole HL, the first functional layer 321 and the second functional layer 323 may be disconnected with respect to the hole HL. Accordingly, the second inorganic layer PVX2 may prevent or reduce the inflow of external moisture or oxygen into the light-emitting element LE. Therefore, the reliability of the display device 1 may be improved.

In an embodiment, at least one selected from a first functional layer pattern 321P including a same material as that of the first functional layer 321 and a second functional layer pattern 323P including a same material as that of the second functional layer 323 may be arranged in the hole HL. In an embodiment, an opposite electrode pattern 330P including a same material as that of the opposite electrode 330 may be disposed on the first functional layer pattern 321P and/or the second functional layer pattern 323P.

The inorganic encapsulation layer 410 may be disposed on the light-emitting element layer 300. The inorganic encapsulation layer 410 may continuously and completely overlap the first pixel area PA1 and the first connection area CA1. The inorganic encapsulation layer 410 may be in direct contact with the lower surface of the protruding tip PT of the second inorganic layer PVX2. Accordingly, the inorganic encapsulation layer 410 may prevent or reduce the inflow of external moisture or oxygen into the light-emitting element LE.

In some embodiments, an organic encapsulation layer (not illustrated) may be disposed on the inorganic encapsulation layer 410 to overlap the light-emitting element LE. In some embodiments, an additional inorganic encapsulation layer (not illustrated) may be further disposed on the organic encapsulation layer.

Although not illustrated, a touch sensor layer and an optical function layer may be further disposed on the inorganic encapsulation layer 410. The touch sensor layer may be disposed on the inorganic encapsulation layer 410. The touch sensor layer may sense coordinate information according to an external input, for example, a touch event. The touch sensor layer may include a sensor electrode (not illustrated) and touch wirings (not illustrated) connected to the sensor electrode. The touch sensor layer may sense an external input by using a self-capacitance method or a mutual capacitance method.

The optical function layer may be disposed on the touch sensor layer. The optical function layer may reduce the reflectance of light (e.g., external light) incident from the outside toward the display device 1. The optical function layer may improve color purity of light emitted from the display device 1. In an embodiment, the optical function layer may include a retarder and a polarizer. The retarder may be a film-type retarder or a liquid crystal coating-type retarder, and may include a $\lambda/2$ retarder and/or a $\lambda/4$ retarder. The polarizer may be a film-type polarizer or a liquid crystal coating-type polarizer. The film-type polarizer may include a stretched synthetic resin film, and the liquid crystal coating-type polarizer may include liquid crystals arranged in a certain array. The retarder and the polarizer may further include a protective film.

In an alternative embodiment, the optical function layer may include a black matrix and color filters. The color filters may be arranged considering the color of light emitted from each of the pixels of the display device 1. Each of the color filters may include a red, green, or blue pigment or dye. Alternatively, each of the color filters may further include, in addition to the pigment or dye, quantum dots. Alternatively, some color filters may not include the pigment or dye described above, and may include scattering particles, such as titanium oxide.

In an alternative embodiment, the optical function layer may include a destructive interference structure. The destructive interference structure may include a first reflective layer and a second reflective layer on different layers from each other. First reflected light and second reflected light respectively reflected from the first reflective layer and the second reflective layer may destructively interfere with each other, and thus, the reflectance of external light may be reduced.

Figure 7B:
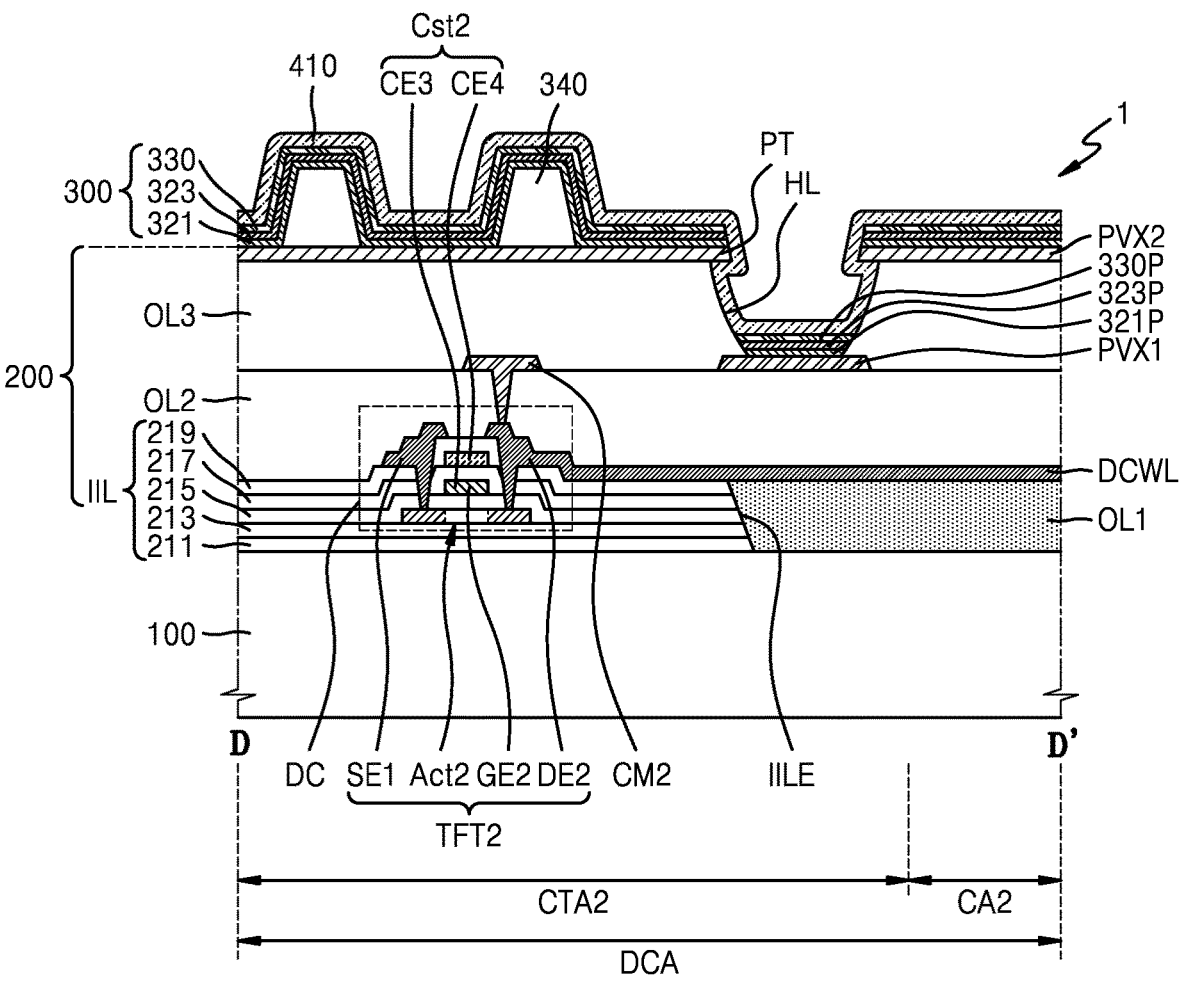
FIG. 7B is a schematic cross-sectional view of the display device taken along line D-D' of FIG. 6, according to an embodiment.

FIG. 7B is a schematic cross-sectional view of the display device 1 taken along line D-D' of FIG. 6, according to an embodiment. In FIG. 7B, the same reference numerals as those in FIG. 7A denote the same members, and any repetitive detailed descriptions thereof will be omitted.

Referring to FIG. 7B, an embodiment of the display device 1 may include a driving circuit area DCA. The driving circuit area DCA may include a second central area CTA2 and a second connection area CA2. The driving circuit area DCA may include a substrate 100, a circuit layer 200, a light-emitting element layer 300, and an inorganic encapsulation layer 410.

The circuit layer 200 may be disposed on the substrate 100. The circuit layer 200 may include a driving circuit DC, a driving circuit wiring DCWL, a first organic insulating layer OL1, a second organic insulating layer OL2, a second contact electrode CM2, a third organic insulating layer OL3, a first inorganic layer PVX1, and a second inorganic layer PVX2. The driving circuit DC may include a second transistor TFT2 and a second storage capacitor Cst2. The second transistor TFT2 may include a second semiconductor layer Act2, a second gate electrode GE2, a second source electrode SE2, and a second drain electrode DE2. The second storage capacitor Cst2 may include a third capacitor electrode CE3 and a fourth capacitor electrode CE4.

An inorganic insulating layer IIL may be disposed on the substrate 100. The inorganic insulating layer IIL may include a barrier layer 211, a buffer layer 213, a first gate insulating layer 215, a second gate insulating layer 217, and an interlayer insulating layer 219.

The second semiconductor layer Act2 may be between the buffer layer 213 and the first gate insulating layer 215. The second semiconductor layer Act2 may include polysilicon. Alternatively, the second semiconductor layer Act2 may include amorphous silicon, an oxide semiconductor, or an organic semiconductor. In an embodiment, the second semiconductor layer Act2 may include a channel region, and a source region and a drain region respectively on opposing sides of the channel region.

The second gate electrode GE2 may be between the first gate insulating layer 215 and the second gate insulating layer 217. The second gate electrode GE2 may overlap the channel region of the second semiconductor layer Act2. The second gate electrode GE2 may include a low-resistance metal material. In an embodiment, the second gate electrode GE2 may include a conductive material including molybdenum (Mo), aluminum (Al), copper (Cu), titanium (Ti), or the like, and may be defined by a single layer or layers, each including the conductive material described above.

The fourth capacitor electrode CE4 may be between the second gate insulating layer 217 and the interlayer insulating layer 219. The fourth capacitor electrode CE4 may overlap the second gate electrode GE2. In such an embodiment, the second gate electrode GE2 may function as the third capacitor electrode CE3. FIG. 7B illustrates an embodiment where the second storage capacitor Cst2 overlaps the second transistor TFT2, but not being limited thereto. In an alternative embodiment, the second storage capacitor Cst2 may not overlap the second transistor TFT2. In this case, the third capacitor electrode CE3 and the second gate electrode GE2 may be separate electrodes. The fourth capacitor electrode CE4 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may be defined by a single layer or layers, each including the material described above.

The second source electrode SE2 and the second drain electrode DE2 may be disposed on the interlayer insulating layer 219. The second source electrode SE2 and the second drain electrode DE2 may be respectively connected to the second semiconductor layer Act2 through contact holes provided or defined in the first gate insulating layer 215, the second gate insulating layer 217, and the interlayer insulating layer 219. At least one selected from the second source electrode SE2 and the second drain electrode DE2 may include a conductive material including molybdenum (Mo), aluminum (Al), copper (Cu), titanium (Ti), or the like, and may be defined by a single layer or layers, each including the conductive material described above. In an embodiment, at least one selected from the second source electrode SE2 and the second drain electrode DE2 may have a multi-layer structure of Ti/Al/Ti.

In an embodiment, the inorganic insulating layer IIL may overlap the second central area CTA2, and may not overlap the second connection area CA2. The inorganic insulating layer IIL may have an end IILE of the inorganic insulating layer IIL facing the second connection area CA2. Accordingly, the display device 1 may be flexible in the second connection area CA2. In some embodiments, the inorganic insulating layer IIL may be continuously arranged in the second central area CTA2 and the second connection area CA2. Hereinafter, embodiments in which the inorganic insulating layer IIL has the end IILE will be mainly described in detail.

The first organic insulating layer OL1 may overlap the second connection area CA2. The first organic insulating layer OL1 may cover the end IILE of the inorganic insulating layer IIL. The first organic insulating layer OL1 may minimize a height difference when the driving circuit wiring DCWL extends from the second central area CTA2 to the second connection area CA2, or may absorb stress that may be simultaneously applied to the driving circuit wiring DCWL.

The driving circuit wiring DCWL may be disposed on the inorganic insulating layer IIL and the first organic insulating layer OL1. The driving circuit wiring DCWL may extend from the second central area CTA2 to the second connection area CA2. The driving circuit wiring DCWL may be connected to the driving circuit DC. In some embodiments, the driving circuit wiring DCWL may be integrally formed as a single unitary and indivisible body along with the second source electrode SE2 or the second drain electrode DE2. In some embodiments, the driving circuit wiring DCWL may be connected to the second gate electrode GE2. In such an embodiment where the driving circuit wiring DCWL is between the first organic insulating layer OL1 and the second organic insulating layer OL2 in the second connection area CA2, the driving circuit wiring DCWL may be located on a stress neutral plane. Accordingly, stress applied to the driving circuit wiring DCWL may be minimized.

The second contact electrode CM2 may overlap the second central area CTA2, and may be between the second organic insulating layer OL2 and the third organic insulating layer OL3. The second contact electrode CM2 may be connected to the driving circuit DC through a contact hole defined in the second organic insulating layer OL2. The second contact electrode CM2 may include a conductive material including molybdenum (Mo), aluminum (Al), copper (Cu), titanium (Ti), or the like, and may be defined by a single layer or layers, each including the conductive material described above. The second contact electrode CM2 may have a multi-layer structure of Ti/Al/Ti.

An emission layer may not be arranged in the non-display area NDA.

Figure 8:
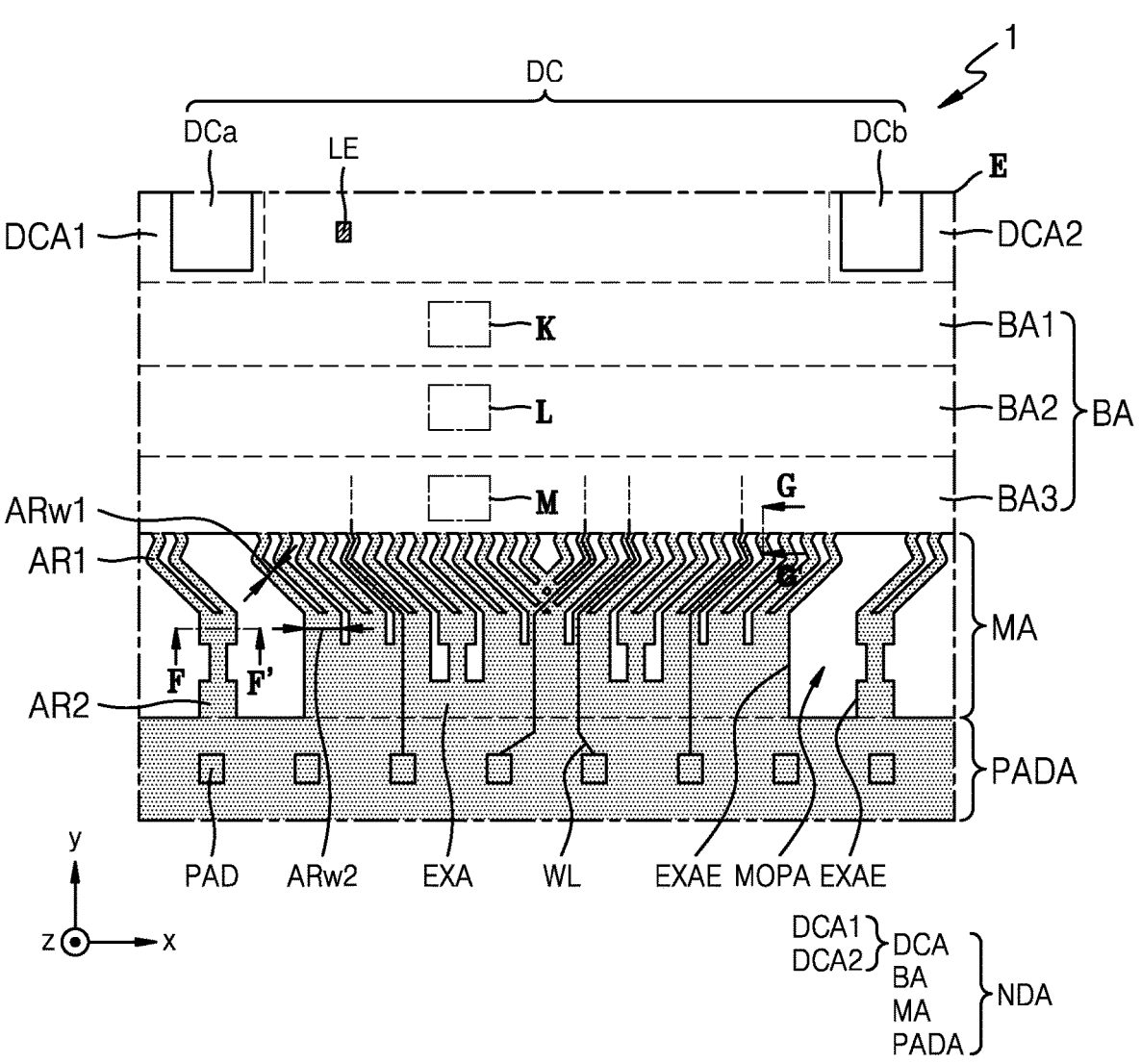
FIG. 8 is an enlarged plan view schematically illustrating a portion E of the display device of FIG. 3, according to an embodiment.

FIG. 8 is an enlarged plan view schematically illustrating a portion E of the display device 1 of FIG. 3, according to an embodiment. In FIG. 8, the same reference numerals as those in FIG. 3 denote the same members, and any repetitive detailed descriptions thereof will be omitted.

Referring to FIG. 8, an embodiment of the display device 1 may include a display area DA and a non-display area NDA. The display area DA may include a light-emitting element LE. The non-display area NDA may be adjacent to the display area DA. The non-display area NDA may include a driving circuit area DCA, a buffer area BA, a middle area MA, a wiring WL, and a pad area PADA. The driving circuit area DCA, the buffer area BA, the middle area MA, and the pad area PADA may be a non-display area.

The driving circuit area DCA may be adjacent to the display area DA in the first direction (e.g., the x direction or the −x direction). The driving circuit area DCA may include a driving circuit DC. In an embodiment, the driving circuit area DCA may include a first driving circuit area DCA1 and a second driving circuit area DCA2. The driving circuit DC may include a left driving circuit DCa arranged in the first driving circuit area DCA1 and a right driving circuit DCb arranged in the second driving circuit area DCA2.

The buffer area BA may be adjacent to the display area DA and the driving circuit area DCA in the second direction (e.g., the y direction or the −y direction). The wiring WL may be arranged in the buffer area BA. The wiring WL may extend from the pad area PADA to the middle area MA and the buffer area BA.

The buffer area BA may include a first buffer area BA1, a second buffer area BA2, and a third buffer area BA3. The first buffer area BA1, the second buffer area BA2, and the third buffer area BA3 may be sequentially arranged from the display area DA to the middle area MA. In an embodiment, for example, the first buffer area BA1 may be adjacent to the display area DA. The third buffer area BA3 may be adjacent to the middle area MA. The second buffer area BA2 may be between the first buffer area BA1 and the third buffer area BA3.

When an external force is applied to the first buffer area BA1, the first buffer area BA1 may be stretched or contracted. In an embodiment, for example, when an external force is applied to the first buffer area BA1 in the first direction (e.g., the x direction or the −x direction) and/or the second direction (e.g., the y direction or the −y direction), the first buffer area BA1 may be stretched or contracted in the first direction (e.g., the x direction or the −x direction) and/or the second direction (e.g., the y direction or the −y direction). In an embodiment, a stretch/contraction ratio of the first buffer area BA1 in the second direction (e.g., the y direction or the −y direction) may be a ratio of a change in the length of the first buffer area BA1 in the second direction (e.g., the y direction or the −y direction) when an external force (or a predetermined force) is applied thereto to the length of the first buffer area BA1 in the second direction (e.g., the y direction or the −y direction) when no external force is applied thereto.

Similar to the first buffer area BA1, when an external force is applied to the second buffer area BA2, the second buffer area BA2 may be stretched or contracted. In an embodiment, a stretch/contraction ratio of the second buffer area BA2 in the second direction (e.g., the y direction or the −y direction) may be a ratio of a change in the length of the second buffer area BA2 in the second direction (e.g., the y direction or the −y direction) when an external force (or a predetermined force) is applied thereto to the length of the second buffer area BA2 in the second direction (e.g., the y direction or the −y direction) when no external force is applied thereto.

Similar to the second buffer area BA2, when an external force is applied to the third buffer area BA3, the third buffer area BA3 may be stretched or contracted. In an embodiment, a stretch/contraction ratio of the third buffer area BA3 in the second direction (e.g., the y direction or the −y direction) may be a ratio of a change in the length of the third buffer area BA3 in the second direction (e.g., the y direction or the −y direction) when an external force (or a predetermined force) is applied thereto to the length of the third buffer area BA3 in the second direction (e.g., the y direction or the −y direction) when no external force is applied thereto.

The stretch/contraction ratio of the first buffer area BA1 in the second direction (e.g., the y direction or the −y direction) may be different from the stretch/contraction ratio of the second buffer area BA2 in the second direction (e.g., the y direction or the −y direction). The stretch/contraction ratio of the second buffer area BA2 in the second direction (e.g., the y direction or the −y direction) may be different from the stretch/contraction ratio of the third buffer area BA3 in the second direction (e.g., the y direction or the −y direction).

In an embodiment, the stretch/contraction ratio of the first buffer area BA1 in the second direction (e.g., the y direction or the −y direction) may be greater than the stretch/contraction ratio of the second buffer area BA2 in the second direction (e.g., the y direction or the −y direction), and the stretch/contraction ratio of the second buffer area BA2 in the second direction (e.g., the y direction or the −y direction) may be less than the stretch/contraction ratio of the third buffer area BA3 in the second direction (e.g., the y direction or the −y direction). In such an embodiment, the second buffer area BA2 may function as a buffer between the first buffer area BA1 and the third buffer area BA3. Accordingly, the second buffer area BA2 may reduce strain propagation between the first buffer area BA1 and the third buffer area BA3, and may prevent or reduce a damage to the display device 1.

In an alternative embodiment, the stretch/contraction ratio of the first buffer area BA1 in the second direction (e.g., the y direction or the −y direction) may be less than the stretch/contraction ratio of the second buffer area BA2 in the second direction (e.g., the y direction or the –y direction), and the stretch/contraction ratio of the second buffer area BA2 in the second direction (e.g., the y direction or the –y direction) may be greater than the stretch/contraction ratio of the third buffer area BA3 in the second direction (e.g., the y direction or the –y direction). In such an embodiment, when an external force is applied to the buffer area BA, the second buffer area BA2 may be further deformed than the first buffer area BA1 and the third buffer area BA3.

The stretch/contraction ratio of the display area DA in the second direction (e.g., the y direction or the –y direction) may be greater than the stretch/contraction ratio of the first buffer area BA1 in the second direction (e.g., the y direction or the –y direction). The stretch/contraction ratio of the display area DA in the second direction (e.g., the y direction or the –y direction) may be greater than the stretch/contraction ratio of the second buffer area BA2 in the second direction (e.g., the y direction or the –y direction). The stretch/contraction ratio of the display area DA in the second direction (e.g., the y direction or the –y direction) may be greater than the stretch/contraction ratio of the third buffer area BA3 in the second direction (e.g., the y direction or the –y direction). Therefore, the buffer area BA with a relatively small degree of deformation may prevent or reduce a damage to the display device 1 between the display area DA and the middle area MA. In addition, the wiring WL that may be arranged in the buffer area BA may be protected.

The middle area MA may be adjacent to the buffer area BA in the second direction (e.g., the y direction or the –y direction). The buffer area BA may be between the middle area MA and the display area DA. The wiring WL may be arranged in the middle area MA. When an external force is applied to the middle area MA, the middle area MA may be stretched or contracted. In an embodiment, for example, the middle area MA may be stretched or contracted in the first direction (e.g., the x direction or the –x direction) and/or the second direction (e.g., the y direction or the –y direction).

The stretch/contraction ratio of the middle area MA may be greater than or equal to the stretch/contraction ratio of the buffer area BA. In an embodiment, the stretch/contraction ratio of the middle area MA in the second direction (e.g., the y direction or the –y direction) may be greater than or equal to the stretch/contraction ratio of the buffer area BA in the second direction (e.g., the y direction or the –y direction). In an embodiment, the stretch/contraction ratio of the middle area MA in the first direction (e.g., the x direction or the –x direction) may be greater than or equal to the stretch/contraction ratio of the buffer area BA in the first direction (e.g., the x direction or the –x direction).

The middle area MA may include a plurality of extension areas EXA and a middle opening area MOPA. The extension areas EXA may extend from the pad area PADA to the buffer area BA. The middle opening area MOPA may be between the adjacent extension areas EXA. The middle opening area MOPA may be defined at least partially by edges EXAE of the adjacent extension areas EXA. The middle opening area MOPA may be a portion of the middle area MA in which components of the display device 1 are not arranged. In such an embodiment, when an external force is applied to the middle area MA, the middle area MA may be stretched or contracted, and stress may not be concentrated even when an external force is applied to the display device 1. Accordingly, the non-display area NDA may be deformed into various shapes without damage.

The wiring WL may be arranged in each of the extension areas EXA. In an embodiment, one wiring WL may be arranged in one extension area EXA. In an alternative embodiment, a plurality of wirings WL may be arranged in one extension area EXA. In some embodiments, the number of the wirings WL arranged in one extension area EXA may be in a range of 1 to 100. The wirings WL may be apart from each other in one extension area EXA. In an embodiment, the wirings WL may be apart from each other in one extension area EXA by about 100 nanometers (nm) or more.

The extension areas EXA may include an extension area EXA. In an embodiment, the shapes of the extension areas EXA may be symmetrical in the second direction (e.g., the y direction or the –y direction). The extension area EXA may include a first area AR1 and a second area AR2. The first area AR1 may be adjacent to the buffer area BA. In an embodiment, the first area AR1 may extend in a direction inclined with respect to the second direction (e.g., the y direction or the –y direction) in a plan view. The second area AR2 may be adjacent to the pad area PADA. In an embodiment, the second area AR2 may extend in the second direction (e.g., the y direction or the –y direction). In an embodiment, a plurality of first areas AR1 may be connected to one second area AR2. In a plan view, a width ARw1 of the first area AR1 in a direction perpendicular to the extending direction of the extension area EXA may be less than a width ARw2 of the second area AR2 in a direction perpendicular to the extending direction of the extension area EXA. In such an embodiment, an elongation of the middle area MA may gradually decrease toward the pad area PADA. Accordingly, even when the shape of the display device 1 is deformed, the pad area PADA is deformed, and thus, a damage to the display device 1 may be effectively prevented or substantially reduced.

The pad area PADA and the buffer area BA may be arranged in the second direction (e.g., the y direction or the –y direction). The middle area MA may be between the pad area PADA and the buffer area BA. The pad area PADA may include a pad PAD. In an embodiment, the wiring WL may be connected to the pad PAD. A plurality of pads PAD may be provided in the pad area PADA. A display driver (not illustrated) and/or a display circuit board (not illustrated) may be arranged in the pad area PADA, and the pad PAD may be electrically connected to the display driver and/or the display circuit board. In an embodiment, an open area may not be defined in the pad area PADA.

When an external force is applied to the pad area PADA, the pad area PADA may be relatively less stretched or contracted. Accordingly, even when the shape of the display device 1 is deformed in a state in which the pad PAD and the display driver and/or the display circuit board are electrically connected to each other, the pad PAD and the display driver and/or the display circuit board may be stably electrically connected to each other.

In some embodiments, an opening area may be defined in the pad area PADA. In such embodiments, the stretch/contraction ratio of the pad area PADA may be less than the stretch/contraction ratio of the buffer area BA or the middle area MA. Accordingly, even when the shape of the display device 1 is deformed in a state in which the pad PAD and the display driver and/or the display circuit board are electrically connected to each other, a driving failure of the display device 1 may be effectively prevented or substantially reduced.

Figure 9A:
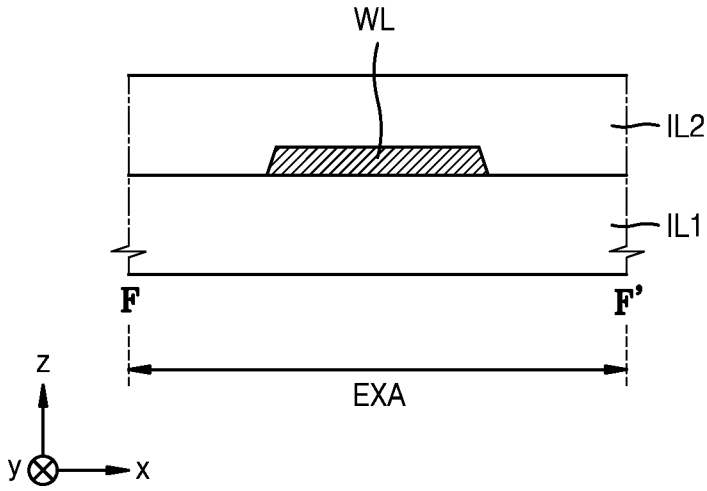
FIGS. 9A and 9B are respectively schematic cross-sectional views of the display device taken along line F-F' of FIG. 8, according to an embodiment.
Figure 9B:
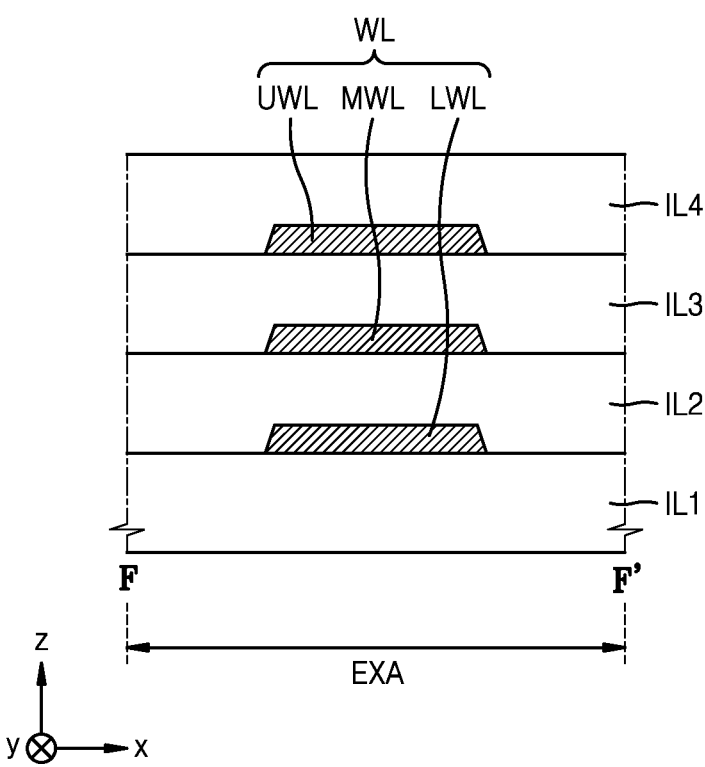

FIGS. 9A and 9B are respectively schematic cross-sectional views of the display device 1 taken along line F-F' of FIG. 8, according to an embodiment.

Referring to FIG. 9A, an embodiment of the display device 1 may include an extension area EXA and a wiring WL arranged in the extension area EXA. The extension area EXA may include a first insulating layer IL1 and a second insulating layer IL2. In an embodiment, the first insulating layer IL1 may include a polymer resin. In an embodiment, for example, the first insulating layer IL1 may include polyimide. In an embodiment, the first insulating layer IL1 may be the substrate 100 of FIG. 7A. In an embodiment, the first insulating layer IL1 may include an organic material. In an embodiment, the first insulating layer IL1 may be the first organic insulating layer OL1 of FIG. 7A.

A wiring WL may be disposed on the first insulating layer IL1. FIG. 7A illustrates an embodiment where one extension area EXA includes one wiring WL, but not being limited thereto. In an alternative embodiment, one extension area EXA may include a plurality of wirings WL apart from each other. The wiring WL may include a conductive material. In an embodiment, the wiring WL may include a conductive material including molybdenum (Mo), aluminum (Al), copper (Cu), titanium (Ti), or the like, and may be defined by a single layer or layers, each including the conductive material described above.

The second insulating layer IL2 may be disposed on the first insulating layer IL1 and the wiring WL. In an embodiment, the second insulating layer IL2 may include an organic material. In an embodiment, the second insulating layer IL2 may be the first organic insulating layer OL1, the second organic insulating layer OL2, or the third organic insulating layer OL3 of FIG. 7A. The wiring WL may be located on a stress neutral plane, and stress applied to the wiring WL may be minimized.

In some embodiments, an inorganic insulating layer (not illustrated) may be disposed above and/or below the wiring WL.

Referring to FIG. 9B, the display device 1 may include an extension area EXA and a wiring WL arranged in the extension area EXA. The extension area EXA may include a first insulating layer IL1, a second insulating layer IL2, a third insulating layer IL3, and a fourth insulating layer IL4. The first insulating layer IL1, the second insulating layer IL2, the third insulating layer IL3, and the fourth insulating layer IL4 may be sequentially stacked one on another. At least one selected from the first insulating layer IL1, the second insulating layer IL2, the third insulating layer IL3, and the fourth insulating layer IL4 may include an organic material or an inorganic material.

The wiring WL may include a lower wiring LWL, a middle wiring MWL, and an upper wiring UWL. The lower wiring LWL, the middle wiring MWL, and the upper wiring UWL may include a conductive material. The lower wiring LWL may be between the first insulating layer IL1 and the second insulating layer IL2. In an embodiment, a plurality of lower wirings LWL may be provided. In an embodiment, the lower wiring LWL may include a same material as that of the first gate electrode GE1 of FIG. 7A. The middle wiring MWL may be between the second insulating layer IL2 and the third insulating layer IL3. In an embodiment, a plurality of middle wirings MWL may be provided. In an embodiment, the middle wiring MWL may include a same material as that of the first source electrode SE1 of FIG. 7A. The upper wiring UWL may be between the third insulating layer IL3 and the fourth insulating layer IL4. In an embodiment, a plurality of upper wirings UWL may be provided. In an embodiment, the upper wiring UWL may include a same material as that of the first contact electrode CM1 of FIG. 7A. In an embodiment where various wirings are used to drive the display device 1, the wirings may be stacked in one extension area EXA. In some embodiments, at least one selected from the lower wiring LWL, the middle wiring MWL, and the upper wiring UWL may be omitted.

Figure 10:
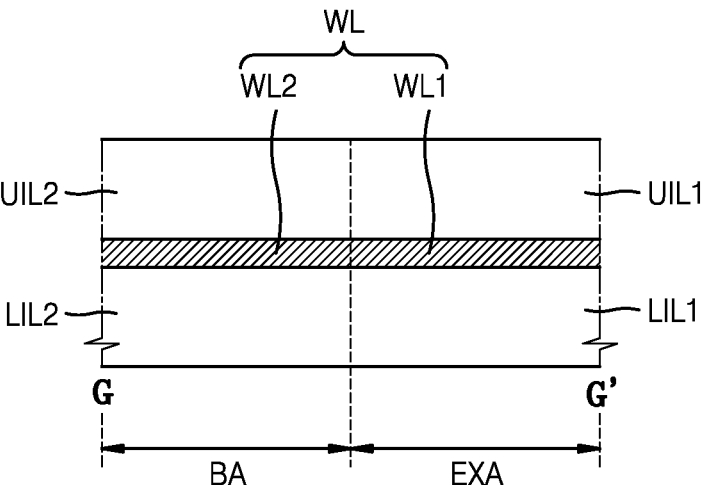
FIG. 10 is a schematic cross-sectional view of a buffer area and an extension area of the display device taken along line G-G' of FIG. 8, according to an embodiment.
Figure 11A:
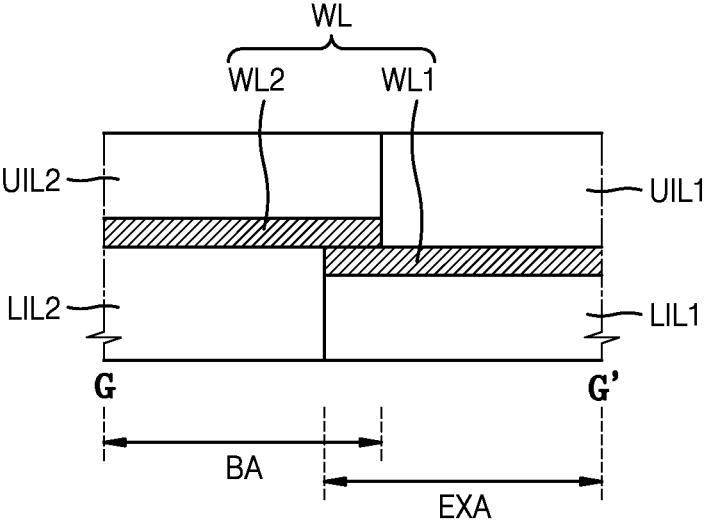
FIGS. 11A and 11B are respectively schematic cross-sectional views of a buffer area and an extension area of the display device taken along line G-G' of FIG. 8, according to an embodiment.
Figure 11B:
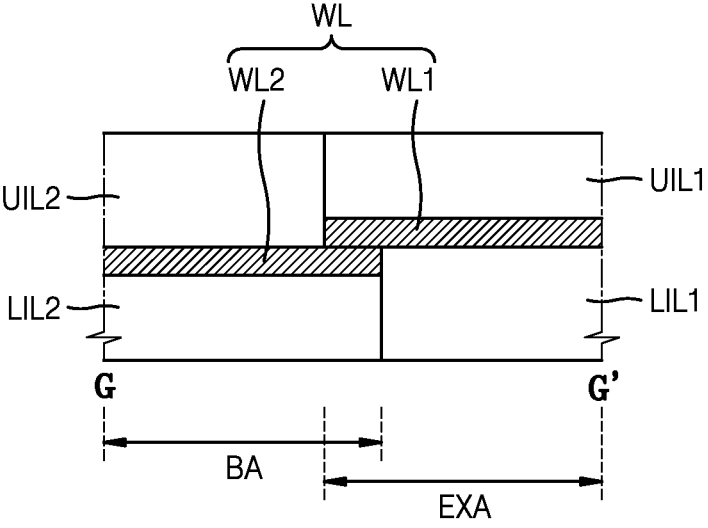

FIG. 10 is a schematic cross-sectional view of the buffer area BA and the extension area EXA of the display device 1 taken along line G-G' of FIG. 8, according to an embodiment. FIGS. 11A and 11B are respectively schematic cross-sectional views of the buffer area BA and the extension area EXA of the display device 1 taken along line G-G' of FIG. 8, according to an embodiment.

FIGS. 10, 11A, and 11B, an embodiment of the display device 1 may include the buffer area BA, the extension area EXA, and the wiring WL. The wiring WL may include a first wiring WL1 and a second wiring WL2. The extension area EXA may include a first lower insulating layer LIL1, a first wiring WL1, and a first upper insulating layer UIL1. The first wiring WL1 may be between the first lower insulating layer LIL1 and the first upper insulating layer UIL1. At least one selected from the first lower insulating layer LIL1 and the first upper insulating layer UIL1 may include an organic material or an inorganic material. The buffer area BA may include a second lower insulating layer LIL2, a second wiring WL2, and a second upper insulating layer UIL2. The second wiring WL2 may be between the second lower insulating layer LIL2 and the second upper insulating layer UIL2. At least one selected from the second lower insulating layer LIL2 and the second upper insulating layer UIL2 may include an organic material or an inorganic material.

Referring to FIG. 10, the first lower insulating layer LIL1 and the second lower insulating layer LIL2 may be integrally formed as a single unitary and indivisible body. The first lower insulating layer LIL1 and the second lower insulating layer LIL2 may include a same material and may be formed simultaneously during a same process. The first wiring WL1 and the second wiring WL2 may be connected to each other. The first wiring WL1 and the second wiring WL2 may be integrally formed as a single unitary and indivisible body. The first wiring WL1 and the second wiring WL2 may include a same material and may be formed simultaneously during a same process. The first upper insulating layer UIL1 and the second upper insulating layer UIL2 may be integrally formed as a single unitary and indivisible body. The first upper insulating layer UIL1 and the second upper insulating layer UIL2 may include a same material and may be formed simultaneously during a same process.

Referring to FIGS. 11A and 11B, the buffer area BA may be bonded to the extension area EXA. The buffer area BA and the extension area EXA may be respectively formed by separate processes and then bonded to each other. The first wiring WL1 and the second wiring WL2 may be connected to each other. At least a portion of the first wiring WL1 may overlap at least a portion of the second wiring WL2. Referring to FIG. 11A, in an embodiment, at least a portion of the second wiring WL2 and at least a portion of the second upper insulating layer UIL2 may be disposed on the first wiring WL1. Referring to FIG. 11B, in an alternative embodiment, at least a portion of the first wiring WL1 and at least a portion of the first upper insulating layer UIL1 may be disposed on the second wiring WL2.

Figure 12:
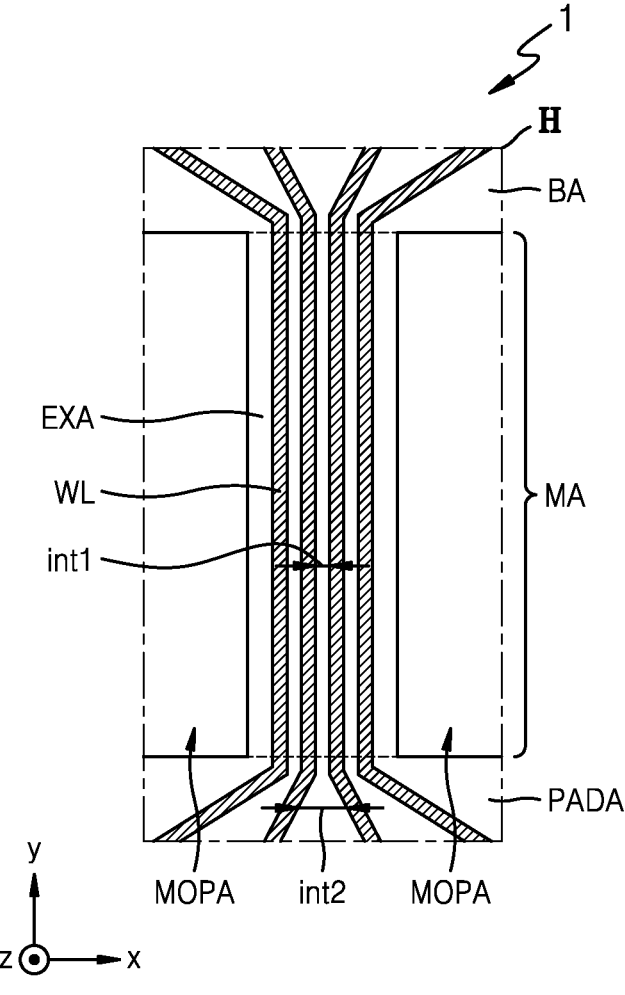
FIG. 12 is an enlarged view of a portion H of the display device of FIG. 3, according to an embodiment.

FIG. 12 is an enlarged view of a portion H of the display device 1 of FIG. 3, according to an embodiment.

Referring to FIG. 12, an embodiment of the display device 1 may include a buffer area BA, a middle area MA, a pad area PADA, and a wiring WL. The middle area MA may be adjacent to the buffer area BA in the second direction (e.g., the y direction or the −y direction). The pad area PADA and the buffer area BA may be arranged in the second direction (e.g., the y direction or the −y direction). The middle area MA may be between the pad area PADA and the buffer area BA.

The middle area MA may include an extension area EXA and a middle opening area MOPA. In an embodiment, the middle area MA may include a plurality of extension areas EXA and a middle opening area MOPA. The extension areas EXA may extend from the pad area PADA to the buffer area BA. The middle opening area MOPA may be adjacent to the extension area EXA. At least a portion of the middle opening area MOPA may be defined by an edge of the extension area EXA.

The wiring WL may be arranged in the extension area EXA. The wiring WL may extend from the extension area EXA to the pad area PADA. The wiring WL may extend from the extension area EXA to the buffer area BA. In an embodiment, a plurality of wirings WL may be arranged in one extension area EXA. In an embodiment, a plurality of wirings WL may be arranged in a plurality of extension areas EXA, respectively. The wirings WL may be apart from each other.

A first interval int1 between the adjacent wirings WL in the extension area EXA may be less than a second interval int2 between the adjacent wirings WL in the pad area PADA. The first interval int1 may be a distance between the wirings WL adjacent to each other in the extension area EXA in the first direction (e.g., the x direction or the −x direction). The second interval int2 may be a distance between the wirings WL adjacent to each other in the pad area PADA in the first direction (e.g., the x direction or the −x direction). In an embodiment, the distance between the adjacent wirings WL may decrease from the pad area PADA to the middle area MA, such that the middle opening area MOPA may be secured in the middle area MA. Accordingly, when an external force is applied to the display device 1, the display device 1 may be deformed without damage even in the middle area MA.

FIGS. 13A to 13F are respectively enlarged views of a portion H of the display device 1 of FIG. 3, according to an embodiment.

Referring to FIGS. 13A to 13F, an embodiment of the display device 1 may include a buffer area BA, a middle area MA, and a pad area PADA. The middle area MA may be adjacent to the buffer area BA in the second direction (e.g., the y direction or the −y direction). The pad area PADA and the buffer area BA may be arranged in the second direction (e.g., the y direction or the −y direction). The middle area MA may be between the pad area PADA and the buffer area BA.

Figure 13A:
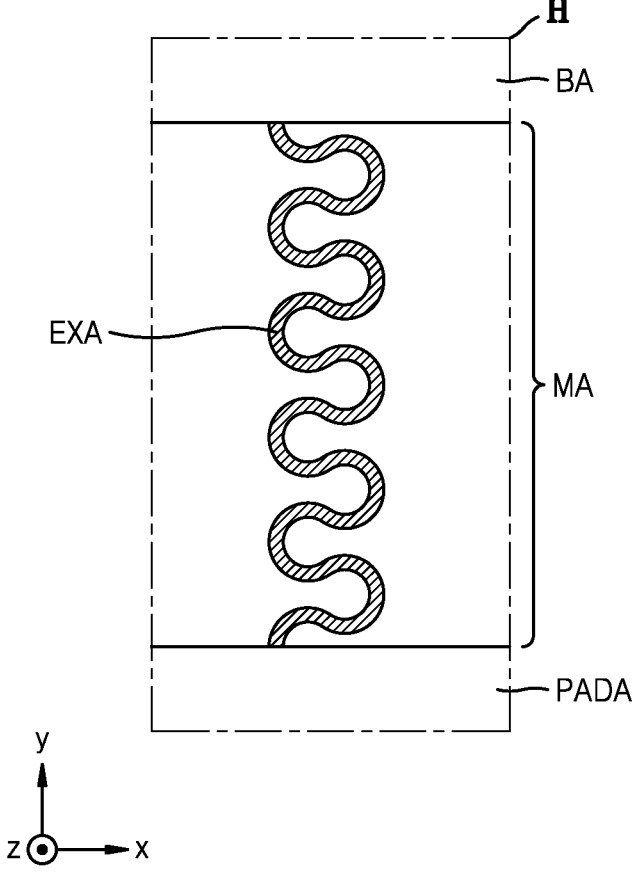
FIGS. 13A to 13F are respectively enlarged views of a portion H of the display device of FIG. 3, according to an embodiment.
Figure 13B:
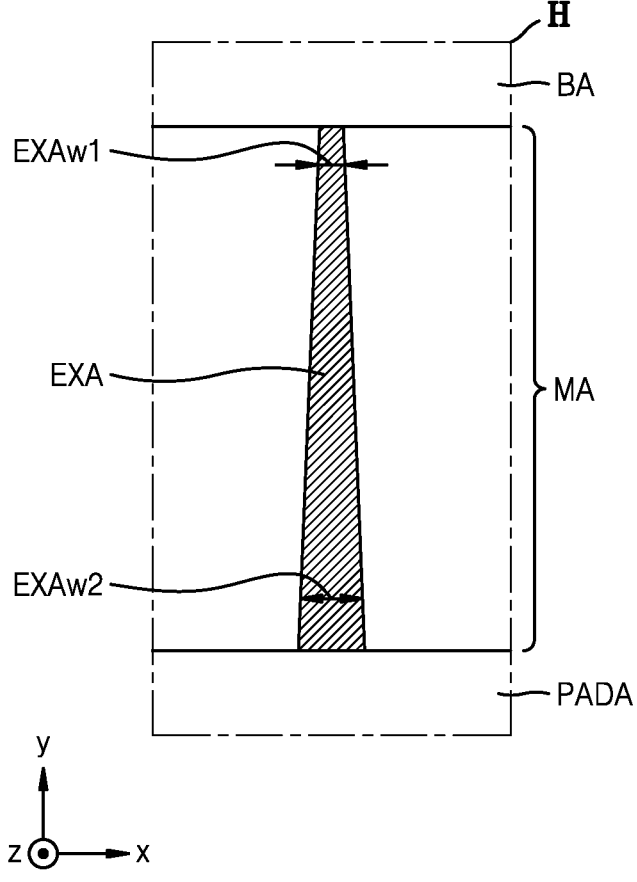
Figure 13C:
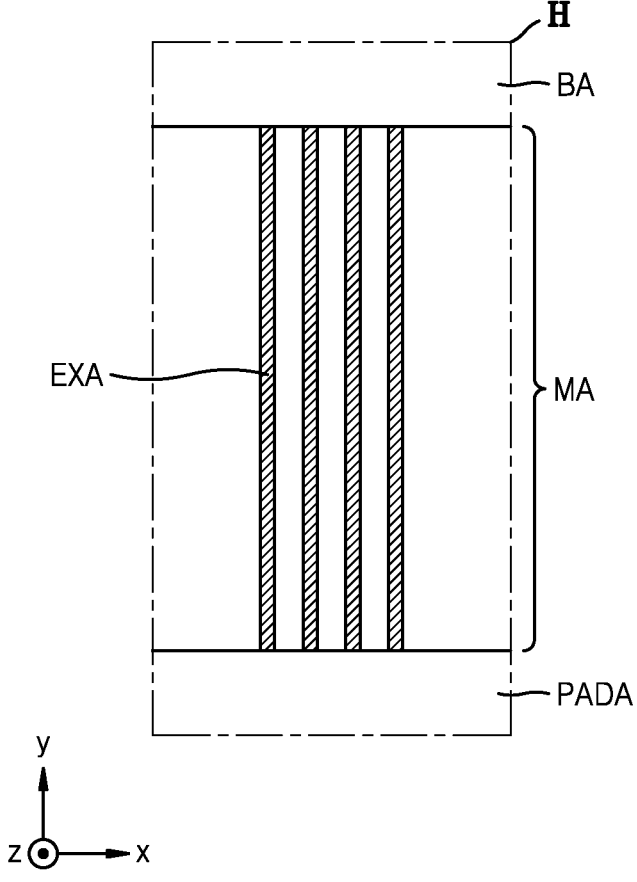

Referring to FIGS. 13A to 13C, the middle area MA may include an extension area EXA. Referring to FIG. 13A, the extension area EXA may extend in a serpentine manner. The extension area EXA may extend in a curved shape in a serpentine manner. In such an embodiment, the, extension area EXA may be independently stretched or contracted in the first direction (e.g., the x direction or the −x direction) and/or the second direction (e.g., the y direction or the −y direction). Referring to FIG. 13B, the extension area EXA may extend in one direction. In an embodiment, for example, the extension area EXA may extend in the second direction (e.g., the y direction or the −y direction). In an embodiment, a width EXAw1 of the extension area EXA adjacent to the buffer area BA may be different from a width EXAw2 of the extension area EXA adjacent to the pad area PADA. In an embodiment, for example, the width EXAw1 of the extension area EXA adjacent to the buffer area BA may be less than the width EXAw2 of the extension area EXA adjacent to the pad area PADA. In such an embodiment, the width of the extension area EXA may gradually decrease from the pad area PADA to the buffer area BA. Referring to FIG. 13C, a plurality of extension areas EXA may be provided.

Figure 13D:
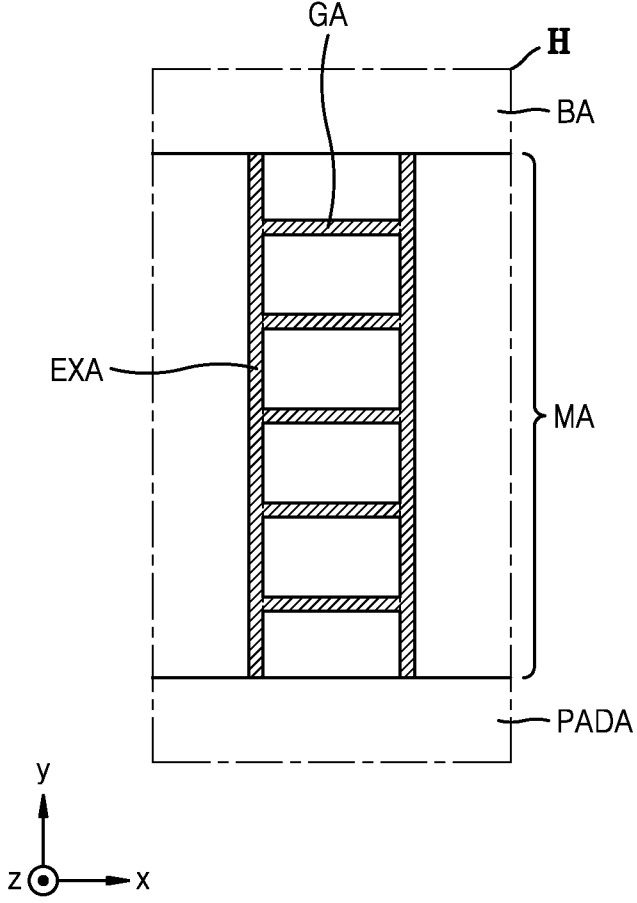
Figure 13E:
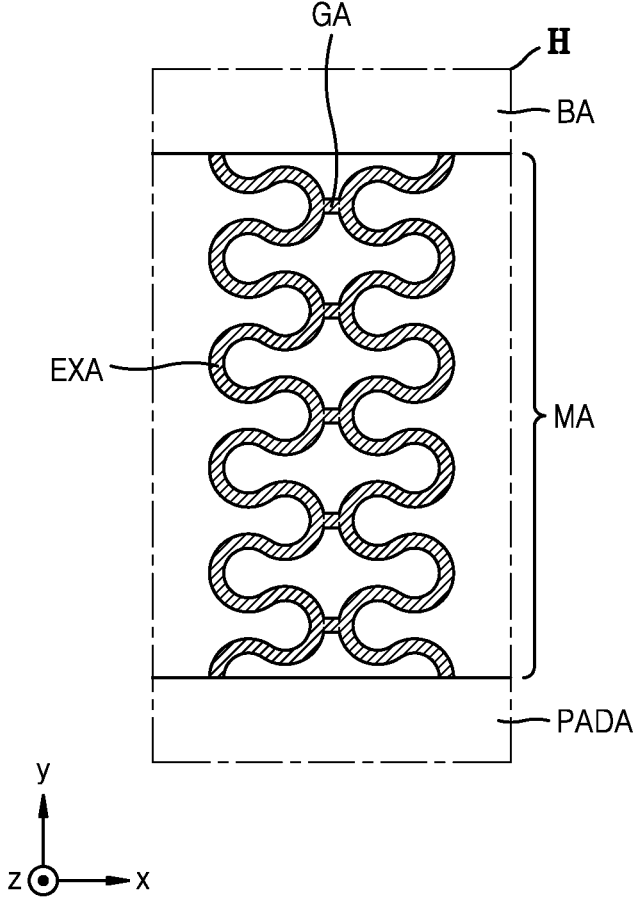
Figure 13F:
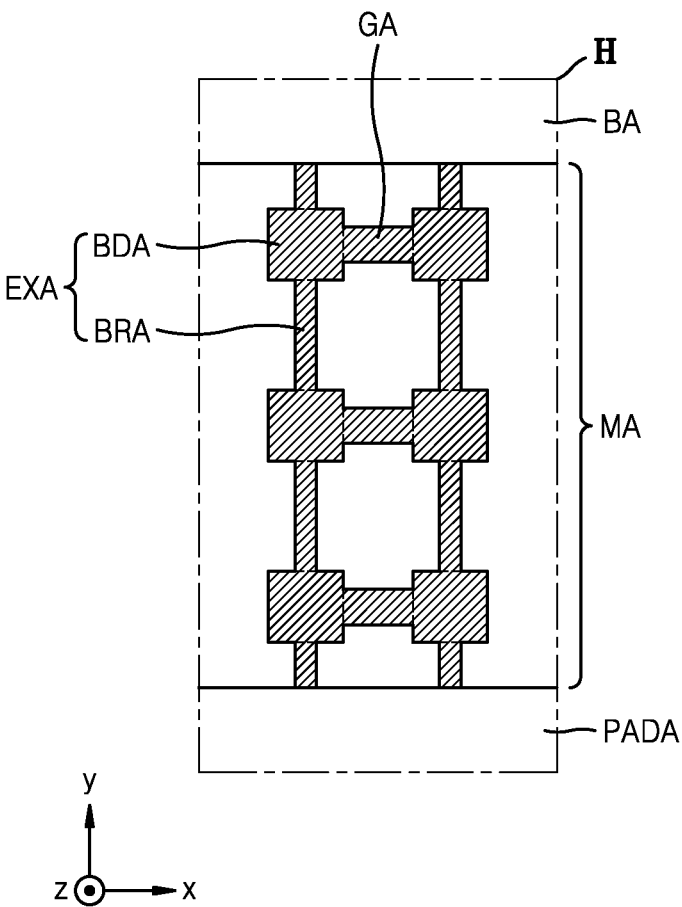

Referring to FIGS. 13D to 13F, the middle area MA may include an extension area EXA and a guide area GA. A plurality of extension areas EXA may be provided, and a guide area GA may be between the adjacent extension areas EXA. The guide area GA may connect the adjacent extension areas EXA to each other. The guide area GA and the adjacent extension areas EXA may be integrally formed as a single unitary and indivisible body. Accordingly, a distance between the adjacent extension areas EXA may be maintained. The middle area MA may be formed by applying a material onto a support substrate and then patterning the material. Then, the extension areas EXA may be detached from the support substrate, and the guide area GA may maintain a distance between the adjacent extension areas EXA. Accordingly, in such an embodiment where the middle area MA including the extension areas EXA is formed, the reliability of the manufacturing process may be increased.

Referring to FIG. 13D, the extension areas EXA may extend in one direction. In an embodiment, for example, the extension areas EXA may extend in the second direction (e.g., the y direction or the −y direction). Referring to FIG. 13E, in an alternative embodiment, the extension areas EXA may each extend in a serpentine manner.

Referring to FIG. 13F, in an alternative embodiment, the extension area EXA may include a body area BDA and a branch area BRA. The branch area BRA may extend from the body area BDA. The extension area EXA may include a plurality of body areas BDA and a plurality of branch areas BRA. The body areas BDA and the branch areas BRA may be alternately arranged in the second direction (e.g., the y direction or the −y direction). The width of the body area BDA may be greater than the width of the branch area BRA. In an embodiment, for example, the width of the body area BDA in the first direction (e.g., the x direction or the −x direction) may be greater than the width of the branch area BRA in the first direction (e.g., the x direction or the −x direction). The guide area GA may be between the body areas BDA adjacent to each other in the first direction (e.g., the x direction or the −x direction). The guide area GA and the body areas BDA adjacent to each other in the first direction (e.g., the x direction or the −x direction) may be integrally formed as a single unitary and indivisible body.

The extension area EXA of the middle area MA may have various shapes. The stretch/contraction ratio of the extension area EXA may be greater than or less than the stretch/contraction ratio of the display area. The stretch/contraction ratio of the extension area EXA may be greater than the stretch/contraction ratio of the buffer area BA. In an embodiment where the middle area MA is desired to be protected relatively strongly, the stretch/contraction ratio of the extension area EXA may be relatively low. In an embodiment where the middle area MA is desired to be deformed relatively flexibly, the stretch/contraction ratio of the extension area EXA may be relatively high.

FIGS. 14A to 14D are respectively enlarged views of a portion I of the display device 1 of FIG. 3, according to an embodiment.

Referring to FIGS. 14A to 14D, an embodiment of the display device 1 may include a middle area MA and a wiring WL. The middle area MA may include an extension area EXA and a guide area GA. A plurality of extension areas EXA may be provided, and a guide area GA may be between the adjacent extension areas EXA. The guide area GA may connect the adjacent extension areas EXA to each other. The guide area GA and the adjacent extension areas EXA may be integrally formed as a single unitary and indivisible body. The wiring WL may be arranged in the extension area EXA. In an embodiment, a plurality of wirings WL may be provided, and the wirings WL may be arranged in the extension areas EXA. The guide area GA may reduce contact and impact between the wirings WL respectively arranged in the adjacent extension areas EXA.

Figure 14A:
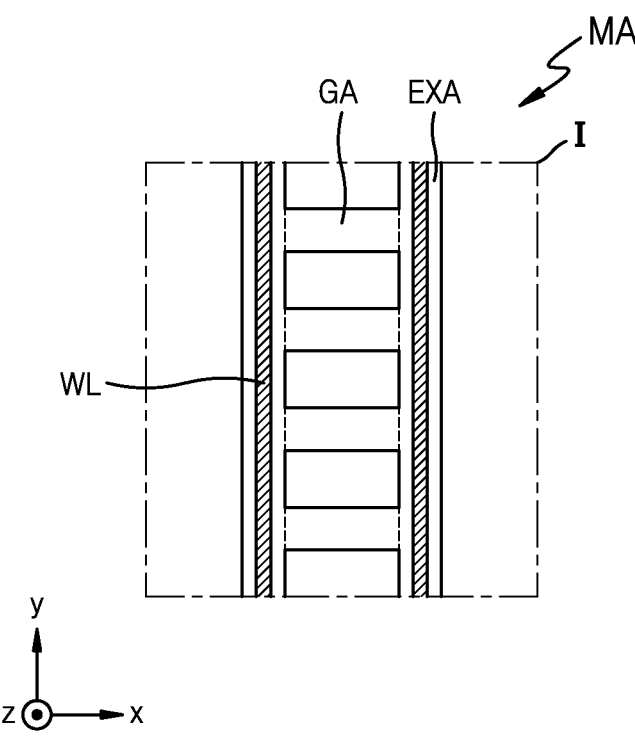
FIGS. 14A to 14D are respectively enlarged views of a portion I of the display device of FIG. 3, according to an embodiment.

Referring to FIG. 14A, in an embodiment, the wiring WL may not be arranged in the guide area GA. A conductive material may not be arranged in the guide area GA.

Figure 14B:
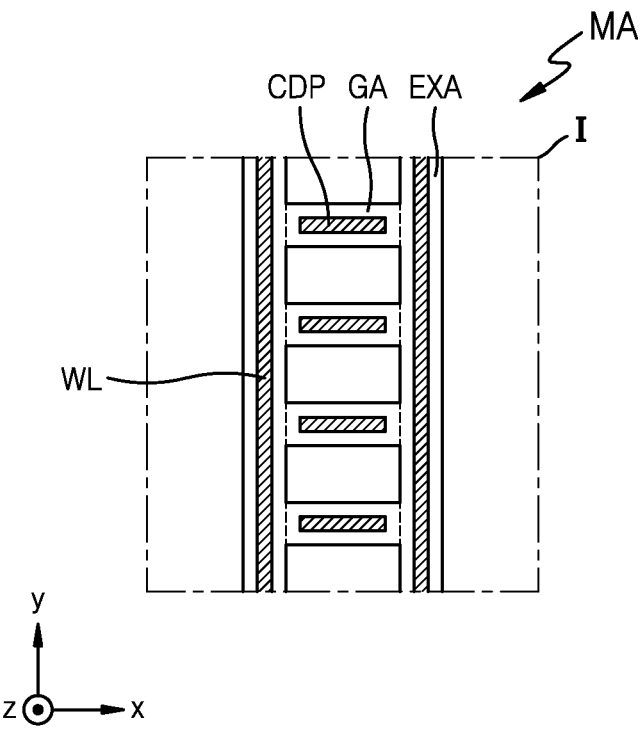

Referring to FIG. 14B, in an alternative embodiment, the guide area GA may include a conductive pattern CDP. The conductive pattern CDP may be apart from the wiring WL. In an embodiment, the conductive pattern CDP may be apart from one of the adjacent wirings WL. The conductive pattern CDP may include a conductive material.

Figure 14C:
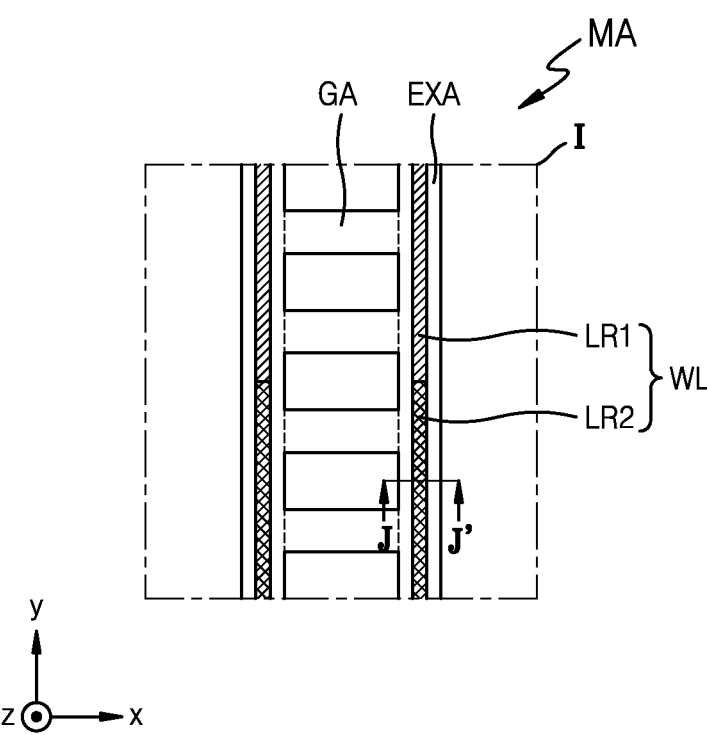
Figure 14D:
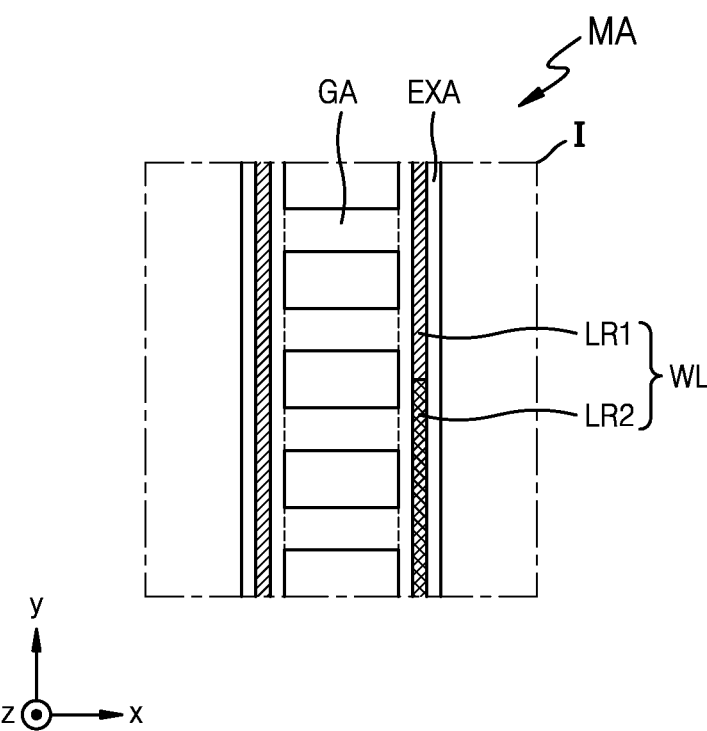

Referring to FIGS. 14C and 14D, in another alternative embodiment, the wiring WL may include a first layer LR1 and a second layer LR2. In a plan view, the first layer LR1 and the second layer LR2 may at least partially overlap each other. The first layer LR1 may include a conductive material. The second layer LR2 may be disposed on the first layer LR1. The stretch/contraction ratio of the second layer LR2 may be greater than the stretch/contraction ratio of the first layer LR1. The second layer LR2 may be stretched. In an embodiment, the first layer LR1 may include a metal material. The second layer LR2 may include at least one selected from a carbon structure and a liquid metal. In an embodiment, the second layer LR2 may include a carbon structure, such as graphene, carbon nanotubes, or nanowires. In an alternative embodiment, the second layer LR2 may include a liquid metal.

At least one of a plurality of wirings WL may include the first layer LR1 and the second layer LR2 disposed on the first layer LR1. Referring to FIG. 14C, in an embodiment, the wirings WL may each include a first layer LR1 and a second layer LR2. Referring to FIG. 14D, in an alternative embodiment, one of a plurality of wirings WL may include a first layer LR1 and a second layer LR2, and another one of the wirings WL may include the first layer LR1 or the second layer LR2. In such an embodiment, the wirings WL may be the same as or different from each other.

Figure 15A:
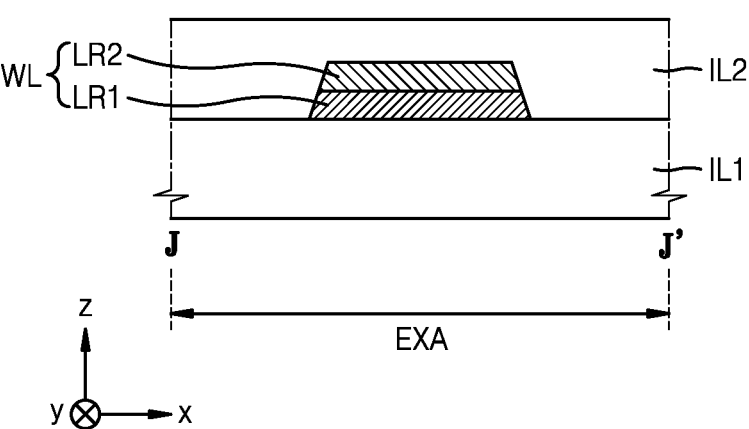
FIGS. 15A and 15B are respectively schematic cross-sectional views of an extension area taken along line J-J' of FIG. 14C, according to an embodiment.
Figure 15B:
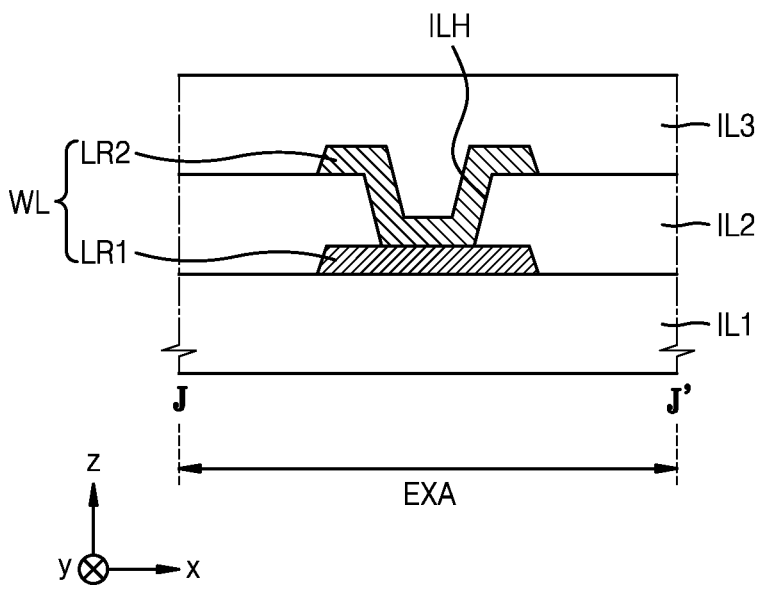

FIGS. 15A and 15B are respectively schematic cross-sectional views of the extension area EXA taken along line J-J' of FIG. 14C, according to an embodiment. In FIGS. 15A and 15B, the same reference numerals as those in FIG. 14C denote the same members, and any repetitive detailed descriptions thereof will be omitted.

Referring to FIG. 15A, the display device 1 may include an extension area EXA and a wiring WL arranged in the extension area EXA. The extension area EXA may include a first insulating layer IL1 and a second insulating layer IL2. The wiring WL may be between the first insulating layer IL1 and the second insulating layer IL2. At least one selected from the first insulating layer IL1 and the second insulating layer IL2 may include an organic material or an inorganic material.

The wiring WL may include a first layer LR1 and a second layer LR2. The second layer LR2 may be disposed on the first layer LR1. In an embodiment, the second layer LR2 may be disposed directly on the first layer LR1 and may be in contact with the first layer LR1.

Referring to FIG. 15B, an embodiment of the display device 1 may include an extension area EXA and a wiring WL arranged in the extension area EXA. The extension area EXA may include a first insulating layer IL1, a second insulating layer IL2, and a third insulating layer IL3, which are sequentially stacked. At least one selected from the first insulating layer IL1, the second insulating layer IL2, and the third insulating layer IL3 may include an organic material or an inorganic material. The wiring WL may include a first layer LR1 and a second layer LR2.

The first layer LR1 may be between the first insulating layer IL1 and the second insulating layer IL2. The second layer LR2 may be between the second insulating layer IL2 and the third insulating layer IL3. The second layer LR2 may be disposed on the first layer LR1. The second layer LR2 may be in contact with the first layer LR1 through an insulating layer hole ILH defined in the second insulating layer IL2.

Figure 16A:
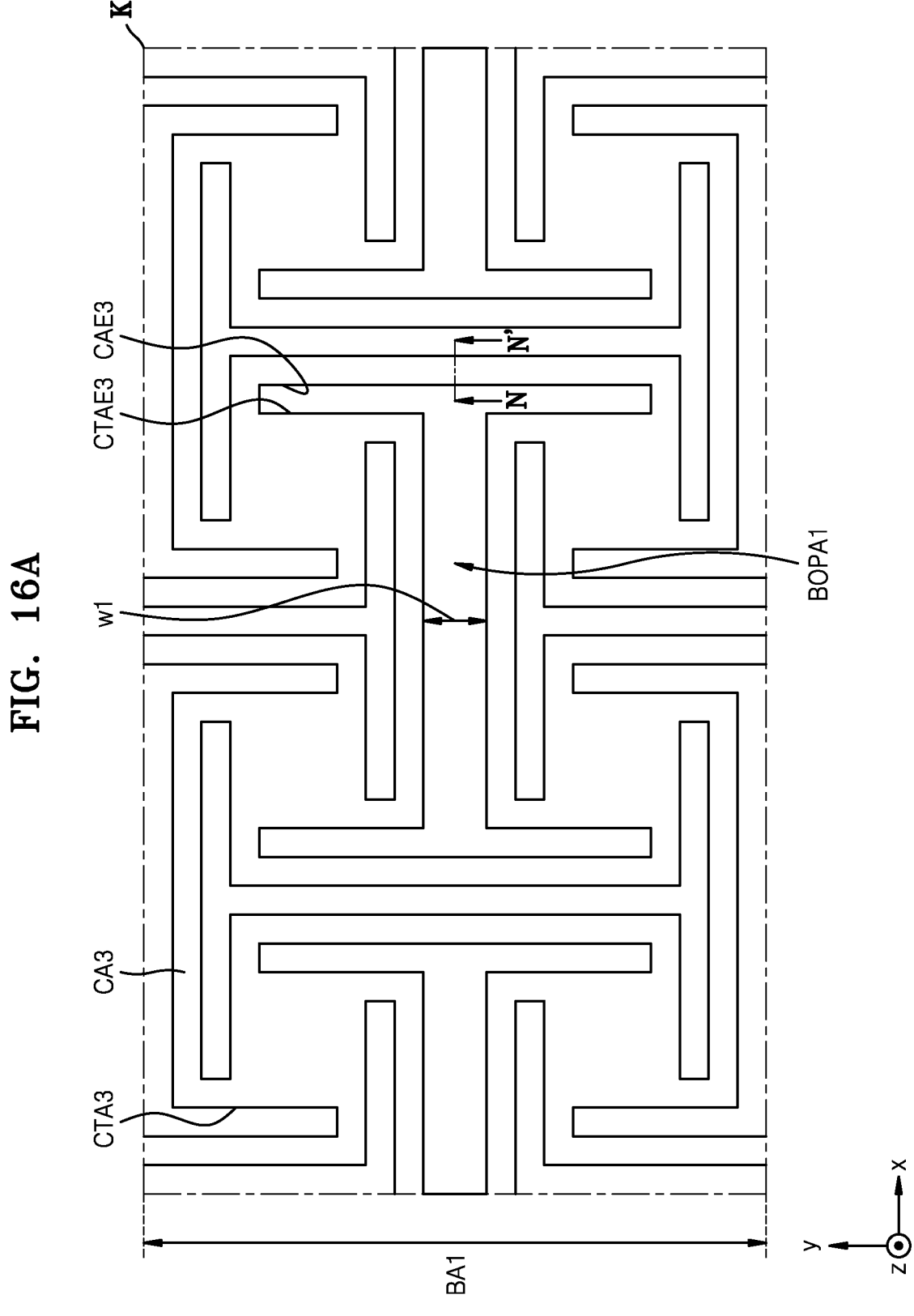
FIG. 16A is an enlarged plan view schematically illustrating a portion K of the display device of FIG. 8, according to an embodiment.
Figure 16B:
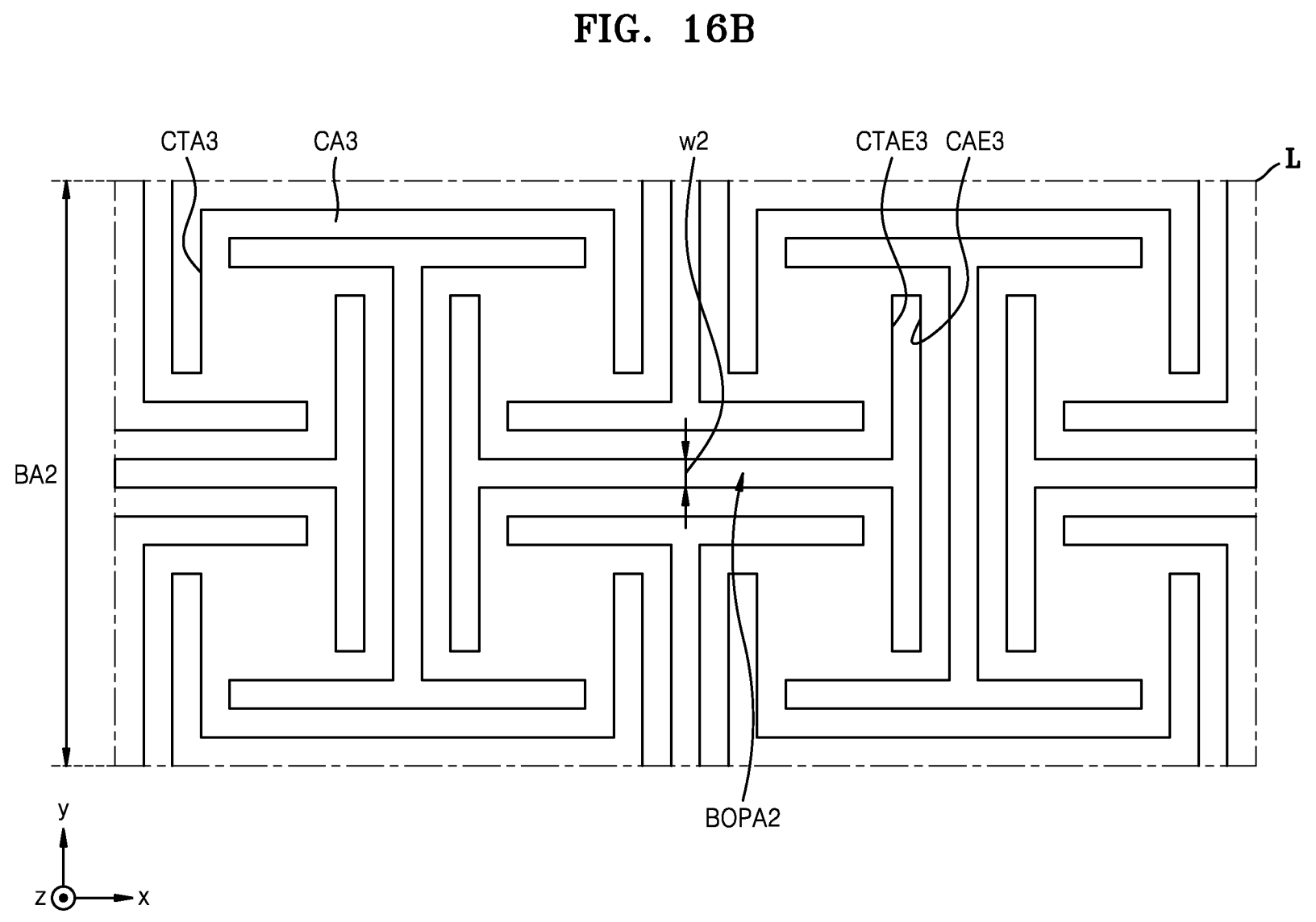
Figure 16C:
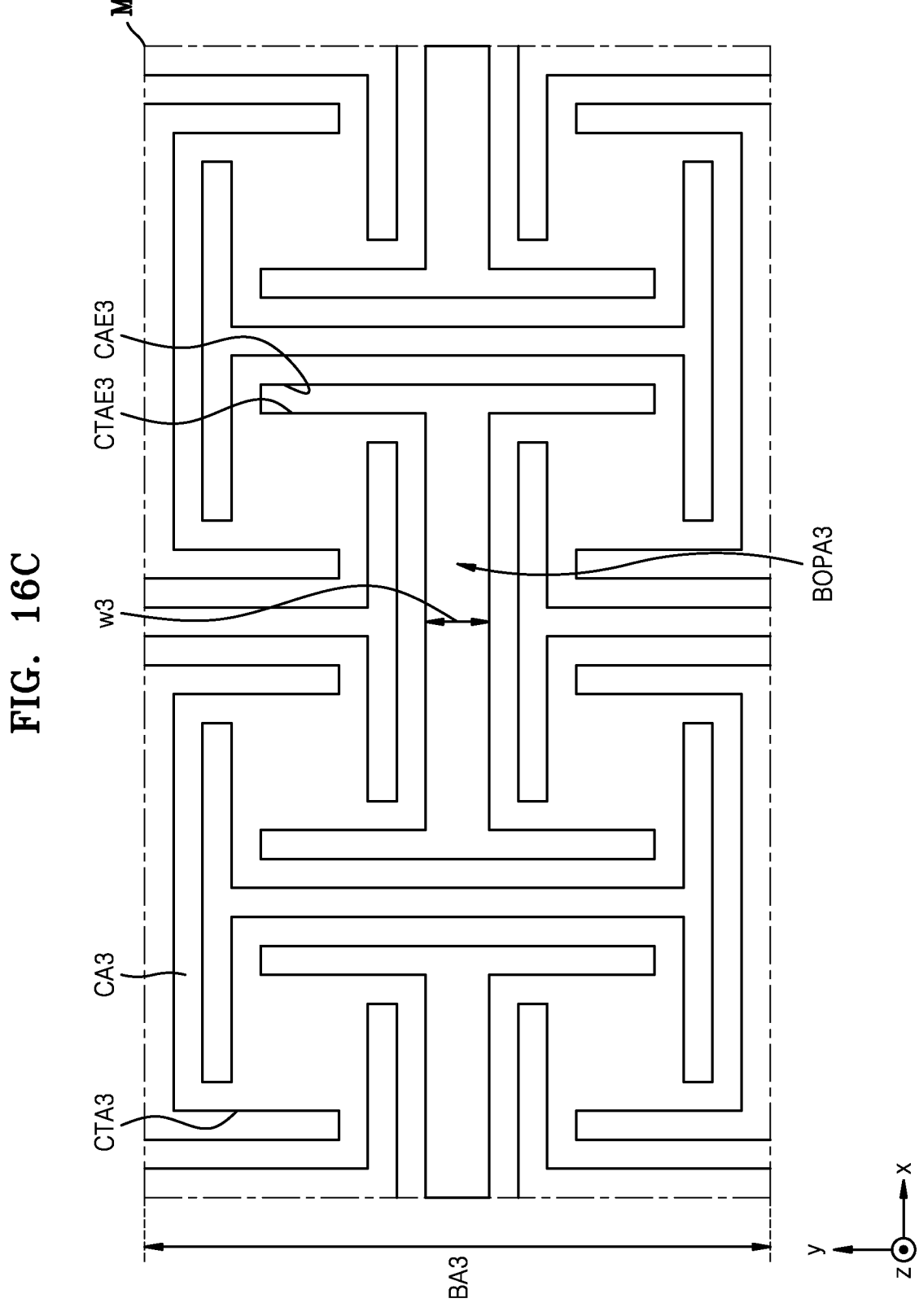
FIG. 16C is an enlarged plan view schematically illustrating a portion M of the display device of FIG. 8, according to an embodiment.

FIG. 16A is an enlarged plan view schematically illustrating a portion K of the display device 1 of FIG. 8, according to an embodiment. FIG. 16B is an enlarged plan view schematically illustrating a portion L of the display device 1 of FIG. 8, according to an embodiment. FIG. 16C is an enlarged plan view schematically illustrating a portion M of the display device 1 of FIG. 8, according to an embodiment.

Referring to FIGS. 16A to 16C, an embodiment of the display device 1 may include a buffer area and wirings arranged in the buffer area. The buffer area may include a first buffer area BA1, a second buffer area BA2, and a third buffer area BA3. A first buffer opening area BOPA1 may be defined in the first buffer area BA1. The first buffer opening area BOPA1 may be a portion of the first buffer area BA1 in which components of the display device 1 are not arranged. A plurality of first buffer opening areas BOPA1 may be provided in the first buffer area BA1, and the first buffer opening areas BOPA1 may be apart from each other. A second buffer opening area BOPA2 may be defined in the second buffer area BA2. The second buffer opening area BOPA2 may be a portion of the second buffer area BA2 in which components of the display device 1 are not arranged. A plurality of second buffer opening areas BOPA2 may be provided in the second buffer area BA2, and the second buffer opening areas BOPA2 may be apart from each other. A third buffer opening area BOPA3 may be defined in the third buffer area BA3. The third buffer opening area BOPA3 may be a portion of the third buffer area BA3 in which components of the display device 1 are not arranged. A plurality of third buffer opening areas BOPA3 may be provided in the third buffer area BA3, and the third buffer opening areas BOPA3 may be apart from each other. Accordingly, when an external force is applied to the first buffer area BA1, the second buffer area BA2, and the third buffer area BA3, the first buffer area BA1, the second buffer area BA2, and the third buffer area BA3 may be deformed without damage.

A first width w1 of the first buffer opening area BOPA1 in the second direction (e.g., the y direction or the −y direction) may be different from a second width w2 of the second buffer opening area BOPA2 in the second direction (e.g., the y direction or the −y direction). The second width w2 of the second buffer opening area BOPA2 in the second direction (e.g., the y direction or the −y direction) may be different from a third width w3 of the third buffer opening area BOPA3 in the second direction (e.g., the y direction or the −y direction). Accordingly, the stretch/contraction ratio of the first buffer area BA1 in the second direction (e.g., the y direction or the −y direction) may be different from the stretch/contraction ratio of the second buffer area BA2 in the second direction (e.g., the y direction or the −y direction). The stretch/contraction ratio of the second buffer area BA2 in the second direction (e.g., the y direction or the −y direction) may be different from the stretch/contraction ratio of the third buffer area BA3 in the second direction (e.g., the y direction or the −y direction).

In an embodiment, the first width w1 may be greater than the second width w2, and the third width w3 may be greater than the second width w2. In such an embodiment, the stretch/contraction ratio of the first buffer area BA1 in the second direction (e.g., the y direction or the −y direction) may be greater than the stretch/contraction ratio of the second buffer area BA2 in the second direction (e.g., the y direction or the −y direction), and the stretch/contraction ratio of the second buffer area BA2 in the second direction (e.g., the y direction or the −y direction) may be less than the stretch/contraction ratio of the third buffer area BA3 in the second direction (e.g., the y direction or the −y direction). The second buffer area BA2 may prevent or reduce a damage to the display device 1 between the first buffer area BA1 and the third buffer area BA3.

In an alternative embodiment, the first width w1 may be less than the second width w2, and the third width w3 may be less than the second width w2. In such an embodiment, the stretch/contraction ratio of the first buffer area BA1 in the second direction (e.g., the y direction or the −y direction) may be less than the stretch/contraction ratio of the second buffer area BA2 in the second direction (e.g., the y direction or the −y direction), and the stretch/contraction ratio of the second buffer area BA2 in the second direction (e.g., the y direction or the −y direction) may be greater than the stretch/contraction ratio of the third buffer area BA3 in the second direction (e.g., the y direction or the −y direction). When an external force is applied to the buffer area BA, the second buffer area BA2 may be further deformed than the first buffer area BA1 and the third buffer area BA3.

The buffer area BA may include a third central area CTA3 and a third connection area CA3. A plurality of third central areas CTA3 may be provided. The third central areas CTA3 may be arranged in the first direction (e.g., the x direction or the −x direction) and/or the second direction (e.g., the y direction or the −y direction).

The third connection area CA3 may be a third bridge area. The adjacent third central areas CTA3 may be connected to each other by the third connection area CA3. In an embodiment, for example, one third central area CTA3 may be connected to four third connection areas CA3. The four third connection areas CA3 may extend from vertices of the one third central area CTA3, respectively. The four third connection areas CA3 may extend to the adjacent third central areas CTA3, respectively. Accordingly, the adjacent third central areas CTA3 may be connected to each other.

The extending direction of the third connection area CA3 may be changed. In an embodiment, for example, the extending direction of the third connection area CA3 may be changed from the second direction (e.g., the y direction or the −y direction) to the first direction (e.g., the x direction or the −x direction). In an alternative embodiment, for example, the extending direction of the third connection area CA3 may be changed from the first direction (e.g., the x direction or the −x direction) to the second direction (e.g., the y direction or the −y direction). FIG. 16A to FIG. 16C illustrates an embodiment where the edge of the third connection area CA3 is bent at a right angle, but not being limited thereto. In an alternative embodiment, the edge of the third connection area CA3 may be bent at various angles.

In another alternative embodiment, the edge of the third connection area CA3 may be curved.

In an embodiment, at least one selected from the first buffer opening area BOPA1, the second buffer opening area BOPA2, and the third buffer opening area BOPA3 may be defined at least partially by an edge CTAE3 of the third central area CTA3 and an edge CAE3 of the third connection area CA3. Referring to FIG. 16A, the first buffer opening area BOPA1 may be defined at least partially by the edge CTAE3 of the third central area CTA3 and the edge CAE3 of the third connection area CA3 in the first buffer area BA1. Referring to FIG. 16B, the second buffer opening area BOPA2 may be defined at least partially by the edge CTAE3 of the third central area CTA3 and the edge CAE3 of the third connection area CA3 in the second buffer area BA2. Referring to FIG. 16C, the third buffer opening area BOPA3 may be defined at least partially by the edge CTAE3 of the third central area CTA3 and the edge CAE3 of the third connection area CA3 in the third buffer area BA3.

FIGS. 16A to 16C illustrate an embodiment where the buffer area has a shape identical to or similar to a shape of the display area DA of FIG. 6, but the disclosure is not limited thereto. In an alternative embodiment, the buffer area may have a shape different from a shape of the display area DA.

Figure 17A:
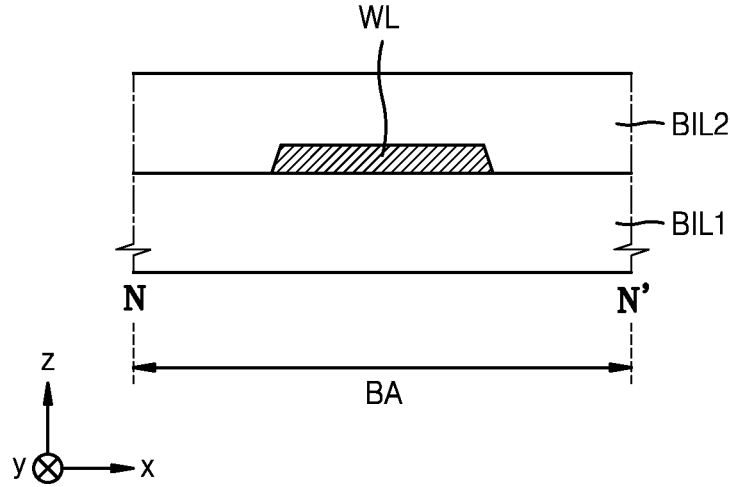
FIGS. 17A and 17B are respectively schematic cross-sectional views of a buffer area taken along line N-N' of FIG. 16A, according to an embodiment.
Figure 17B:
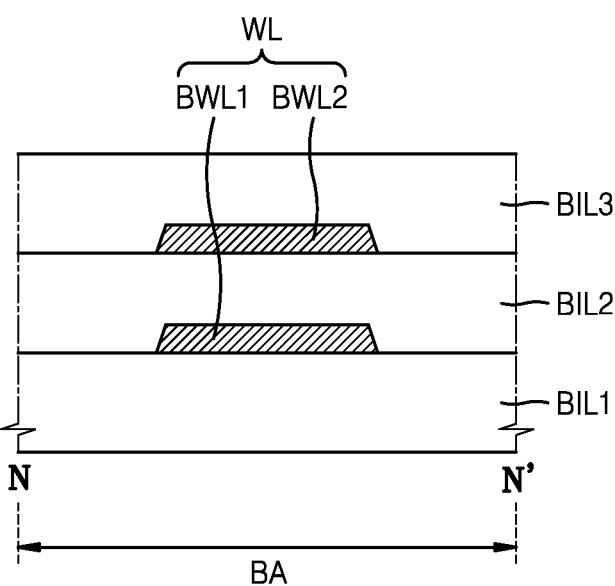

FIGS. 17A and 17B are respectively schematic cross-sectional views of the buffer area BA taken along line N-N' of FIG. 16A, according to an embodiment.

Referring to FIGS. 17A and 17B, an embodiment of the display device 1 may include a buffer area BA and a wiring WL arranged in the buffer area BA.

Referring to FIG. 17A, the buffer area BA may include a first buffer insulating layer BIL1 and a second buffer insulating layer BIL2. The wiring WL may be between the first buffer insulating layer BIL1 and the second buffer insulating layer BIL2. At least one selected from the first buffer insulating layer BIL1 and the second buffer insulating layer BIL2 may include an organic material or an inorganic material. In such an embodiment where the wiring WL is between the first buffer insulating layer BIL1 and the second buffer insulating layer BIL2, the wiring WL may be located on a stress neutral plane. Accordingly, stress applied to the wiring WL may be minimized.

Referring to FIG. 17B, the buffer area BA may include a first buffer insulating layer BIL1, a second buffer insulating layer BIL2, and a third buffer insulating layer BIL3, which are sequentially stacked one on another. At least one selected from the first buffer insulating layer BIL1, the second buffer insulating layer BIL2, and the third buffer insulating layer BIL3 may include an organic material or an inorganic material. The wiring WL may include a first buffer wiring BWL1 and a second buffer wiring BWL2. The first buffer wiring BWL1 may be between the first buffer insulating layer BIL1 and the second buffer insulating layer BIL2. The second buffer wiring BWL2 may be between the second buffer insulating layer BIL2 and the third buffer insulating layer BIL3. As described above, in an embodiment where various wirings are used to drive the display device 1, the wirings may be stacked in the buffer area BA.

In embodiments of the invention, as described above, the display device may include the middle area including the extension areas which extend from the pad area to the buffer area and in which the wirings are arranged, and the middle opening area defined at least partially by the edges of the adjacent extension areas. Accordingly, even when an external force is applied to the display device, stress may not be concentrated in the middle area, which is the non-display area. In such embodiments, in the middle area adjacent to the pad area, the display device may be deformed into various shapes without damage.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a display area comprising a light-emitting element;
a driving circuit area adjacent to the display area in a first direction, wherein the driving circuit area comprises a driving circuit;
a buffer area adjacent to the display area and the driving circuit area in a second direction crossing the first direction, wherein a stretch/contraction ratio of the buffer area in the second direction is less than or equal to a stretch/contraction ratio of the display area in the second direction;
a pad area arranged in the second direction with respect to the buffer area, wherein the pad area comprises a pad; and
a middle area comprising a plurality of extension areas which extend from the pad area to the buffer area, wherein a wiring is arranged in the plurality of extension areas, and a middle opening area is defined in the middle area at least partially by edges of adjacent extension areas,
wherein the buffer area comprises a first buffer area in which a first buffer opening area is defined, a second buffer area in which a second buffer opening area is defined, and a third buffer area in which a third buffer opening area is defined,
the first buffer area, the second buffer area, and the third buffer area are sequentially arranged from the display area to the middle area,
a first width of the first buffer opening area in the second direction is different from a second width of the second buffer opening area in the second direction, and
the second width is different from a third width of the third buffer opening area in the second direction.

2. The display device of claim 1, wherein
the first width is greater than the second width, and
the third width is greater than the second width.

3. The display device of claim 1, wherein
a stretch/contraction ratio of the middle area in the second direction is greater than or equal to the stretch/contraction ratio of the buffer area in the second direction.

4. The display device of claim 1, wherein
a stretch/contraction ratio of the first buffer area in the second direction is greater than a stretch/contraction ratio of the second buffer area in the second direction, and
the stretch/contraction ratio of the second buffer area in the second direction is less than a stretch/contraction ratio of the third buffer area in the second direction.

5. The display device of claim 1, wherein
a stretch/contraction ratio of the first buffer area in the second direction is less than a stretch/contraction ratio of the second buffer area in the second direction, and the stretch/contraction ratio of the second buffer area in the second direction is greater than a stretch/contraction ratio of the third buffer area in the second direction.

6. The display device of claim 1, wherein the driving circuit area, the buffer area, the pad area, and the middle area are non-display areas.

7. The display device of claim 1, wherein
the display area comprises a first central area comprising the light-emitting element, and a first connection area which extends from the first central area, wherein a signal line is arranged in the first connection area, and a first opening area is defined in the display area at least partially by an edge of the first central area and an edge of the first connection area,
the driving circuit area comprises a second central area comprising the driving circuit, and a second connection area which extends from the second central area, wherein a driving circuit wiring is arranged in the second connection area, and a second opening area is defined in the driving circuit area at least partially by an edge of the second central area and an edge of the second connection area,
the buffer area further comprises a third central area and a third connection area extending from the third central area, and
at least one selected from the first buffer opening area, the second buffer opening area, and the third buffer opening area is defined at least partially by an edge of the third central area and an edge of the third connection area.

8. The display device of claim 1, wherein the wiring comprises a first wiring included in one of the plurality of extension areas and a second wiring included in the buffer area and connected to the first wiring.

9. The display device of claim 8, wherein the first wiring and the second wiring are integrally formed as a single unitary and indivisible body.

10. The display device of claim 8, wherein at least a portion of the first wiring overlaps at least a portion of the second wiring.

11. A display device comprising:
a display area comprising a light-emitting element;
a driving circuit area adjacent to the display area in a first direction, wherein the driving circuit area comprises a driving circuit;
a buffer area adjacent to the display area and the driving circuit area in a second direction crossing the first direction, wherein a stretch/contraction ratio of the buffer area in the second direction is less than or equal to a stretch/contraction ratio of the display area in the second direction;
a pad area arranged in the second direction with respect to the buffer area, wherein the pad area comprises a pad; and
a middle area comprising a plurality of extension areas which extend from the buffer area to the pad area, wherein a plurality wirings is arranged in the plurality of extension areas, and a middle opening area is defined in the middle area at least partially by edges of adjacent extension areas,
wherein the plurality of wirings extend from the extension area to the pad area, and
an interval between adjacent wirings among the plurality of wirings in the extension area is less than an interval between the adjacent wirings in the pad area.

12. The display device of claim 11, wherein a stretch/contraction ratio of the middle area in the second direction is greater than or equal to the stretch/contraction ratio of the buffer area in the second direction.

13. The display device of claim 11, wherein the plurality of extension areas comprises an extension area comprising a first area adjacent to the buffer area and a second area adjacent to the pad area, and in a plan view, a width of the first area in a direction perpendicular to an extending direction of the extension area is less than a width of the second area in the direction perpendicular to the extending direction of the extension area.

14. The display device of claim 11, wherein the middle area further comprises a guide area which connects the adjacent extension areas to each other.

15. The display device of claim 14, wherein the guide area comprises a conductive pattern apart from one of the adjacent wirings.

16. The display device of claim 14, wherein a wiring of the plurality of wirings comprises a first layer and a second layer disposed on the first layer, the first layer comprises a metal material, and the second layer comprises at least one selected from a carbon structure and a liquid metal.

17. The display device of claim 11, wherein the driving circuit area, the buffer area, the pad area, and the middle area are non-display areas.

18. The display device of claim 11, wherein one of the adjacent wirings comprises:

a first wiring included in one of the plurality of extension areas; and a second wiring included in the buffer area and connected to the first wiring.

19. The display device of claim 18, wherein the first wiring and the second wiring are integrally formed as a single unitary and indivisible body.

20. The display device of claim 18, wherein at least a portion of the first wiring overlaps at least a portion of the second wiring.

* * * * *